US008952448B2

(12) United States Patent
Yang et al.

(10) Patent No.: US 8,952,448 B2
(45) Date of Patent: Feb. 10, 2015

(54) THREE-DIMENSIONAL SEMICONDUCTOR MEMORY DEVICES AND METHODS FOR MANUFACTURING SAME

(71) Applicants: Junkyu Yang, Seoul (KR); Phil Ouk Nam, Hwaseong-si (KR); Youngseon Son, Hwaseong-si (KR); Kwangyoung Lee, Suwon-si (KR); Kihyun Hwang, Seongnam-si (KR)

(72) Inventors: Junkyu Yang, Seoul (KR); Phil Ouk Nam, Hwaseong-si (KR); Youngseon Son, Hwaseong-si (KR); Kwangyoung Lee, Suwon-si (KR); Kihyun Hwang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/828,557

(22) Filed: Mar. 14, 2013

(65) Prior Publication Data

US 2013/0313631 A1      Nov. 28, 2013

(30) Foreign Application Priority Data

May 22, 2012   (KR) .......................... 10-2012-0054325

(51) Int. Cl.
*H01L 29/66* (2006.01)
*H01L 27/088* (2006.01)
*H01L 27/115* (2006.01)

(52) U.S. Cl.
CPC ........ *H01L 27/088* (2013.01); *H01L 27/11578* (2013.01); *H01L 27/11556* (2013.01)
USPC ........................................................ 257/329

(58) Field of Classification Search
USPC ......................................................... 257/329
See application file for complete search history.

(56) References Cited

U.S. PATENT DOCUMENTS

| | | | | |
|---|---|---|---|---|
| 8,309,405 | B2 * | 11/2012 | Yang et al. | 438/156 |
| 8,598,647 | B2 * | 12/2013 | Kim et al. | 257/315 |
| 2002/0001223 | A1 * | 1/2002 | Saito et al. | 365/158 |
| 2004/0235253 | A1 | 11/2004 | Kim | |
| 2007/0099383 | A1 | 5/2007 | Han et al. | |
| 2009/0278193 | A1 | 11/2009 | Murata et al. | |
| 2009/0283819 | A1 | 11/2009 | Ishikawa et al. | |
| 2010/0059811 | A1 | 3/2010 | Sekine et al. | |
| 2010/0159654 | A1 | 6/2010 | Shim | |
| 2010/0276743 | A1 | 11/2010 | Kuniya et al. | |
| 2012/0083077 | A1 * | 4/2012 | Yang et al. | 438/156 |
| 2012/0112260 | A1 * | 5/2012 | Kim et al. | 257/315 |
| 2012/0112264 | A1 * | 5/2012 | Lee et al. | 257/324 |
| 2012/0139027 | A1 * | 6/2012 | Son et al. | 257/324 |
| 2012/0211823 | A1 * | 8/2012 | Lim et al. | 257/326 |
| 2012/0295409 | A1 * | 11/2012 | Yun et al. | 438/268 |
| 2013/0065369 | A1 * | 3/2013 | Yang et al. | 438/268 |

* cited by examiner

*Primary Examiner* — Bilkis Jahan
(74) *Attorney, Agent, or Firm* — Myers Bigel Sibley & Sajovec, PA

(57) ABSTRACT

A three-dimensional (3D) nonvolatile memory device includes a vertical stack of nonvolatile memory cells on a substrate having a region of first conductivity type therein. A dopant region of second conductivity type is provided in the substrate. This dopant region forms a P-N rectifying junction with the region of first conductivity type and has a concave upper surface that is recessed relative to an upper surface of the substrate upon which the vertical stack of nonvolatile memory cells extends. An electrically insulating electrode separating pattern is provided, which extends through the vertical stack of nonvolatile memory cells and into the recess in the dopant region of second conductivity type.

10 Claims, 25 Drawing Sheets

THREE-DIMENSIONAL SEMICONDUCTOR MEMORY DEVICES AND METHODS FOR MANUFACTURING SAME

REFERENCE TO PRIORITY APPLICATION

This U.S. non-provisional patent application claims priority under 35 U.S.C. §119 to Korean Patent Application No. 10-2012-0054325, filed on May 22, 2012, the entirety of which is incorporated by reference herein.

FIELD

The invention relates to three-dimensional (3D) semiconductor memory devices and methods for manufacturing the same.

BACKGROUND

Semiconductor memory devices have been highly integrated for satisfying high performance and low manufacture costs of semiconductor memory devices which are required by users. Since integration degree of the semiconductor memory devices is an important factor in determining product price, high integrated semiconductor memory devices may be increasingly demanded. Integration degree of typical two-dimensional or planar semiconductor memory devices may be primarily determined by the area occupied by a unit memory cell, such that it may be greatly influenced by the level of a technology for forming fin patterns. However, the extremely expensive processing equipment needed to increase pattern fineness may set a practical limitation on increasing the integration degree of the two-dimensional or planar semiconductor devices.

To overcome the above limitations, three-dimensional semiconductor memory devices having three-dimensionally arranged memory cells have been proposed. However, in order to mass produce three-dimensional semiconductor memory devices, new process technologies should be developed in such a manner that can provide a lower manufacturing cost per bit than two-dimensional memory devices while maintaining or exceeding their level of reliability.

SUMMARY

Embodiments of the inventive concept may provide three-dimensional (3D) semiconductor memory devices having improved reliability.

Embodiments of the inventive concept may provide methods for manufacturing a three-dimensional (3D) semiconductor memory device capable of improving reliability.

Three-dimensional (3D) nonvolatile memory devices according to some embodiments of the invention include a vertical stack of nonvolatile memory cells on a substrate having a region of first conductivity type therein. A dopant region of second conductivity type is provided in the substrate. The dopant region forms a P-N rectifying junction with the region of first conductivity type and has a concave upper surface that is recessed relative to an upper surface of the substrate upon which the vertical stack of nonvolatile memory cells extends. An electrically insulating electrode separating pattern is provided, which extends through the vertical stack of nonvolatile memory cells and into the recess in the dopant region of second conductivity type. The vertical stack of nonvolatile memory cells can include first and second stacks of gate electrodes. The electrically insulating electrode separating region may extend vertically between the first and second stacks of gate electrodes. The electrically insulating electrode separating pattern may also contact the dopant region of second conductivity type. In particular, a bottom surface of the electrically insulating electrode separating pattern may have a convex shape with a radius of curvature that is greater than half a width of the electrically insulating electrode separating pattern.

A method of forming three-dimensional (3D) nonvolatile memory devices according to additional embodiments of the invention may include forming an alternating stack of electrically insulating layers and sacrificial layers on a substrate having a region of first conductivity type therein. The alternating stack of electrically insulating layers and sacrificial layers may be selectively etched to define at least one trench therein that exposes the substrate. Dopants of second conductivity type may be implanted through the at least one trench and into the exposed substrate to define a dopant region of second conductivity type therein. Portions of the sacrificial layers are selectively removed from between the stack of electrically insulating layers to define lateral recess regions therein. The exposed substrate within the at least one trench is selectively etched to define a recess in the dopant region of second conductivity type. The lateral recess regions are filled with conductive memory cell gate electrodes.

According to some of these embodiments of the invention, the step of selectively etching the exposed substrate includes dry etching the exposed substrate after the step of selectively removing portions of the sacrificial layers from between the stack of electrically insulating layers. This dry etching may include exposing portions of the substrate to chlorine gas ($Cl_2$). In addition, the step of selectively removing portions of the sacrificial layers may include exposing the portions of the sacrificial layers to a wet etchant (e.g., phosphoric acid).

According to additional embodiments of the invention, a three-dimensional (3D) semiconductor memory device is provided, which may include: an electrode structure including insulating patterns and conductive patterns which are alternately and repeatedly stacked on a substrate; a semiconductor pattern penetrating the electrode structure and connected to the substrate; and an electrode separating pattern adjacent to a side of the electrode structure. A bottom surface of the electrode separating pattern has a rounded profile. The electrode separating pattern may be in contact with the substrate; and the bottom surface of the electrode separating pattern may be disposed at a level lower than a top surface of the substrate under the electrode structure. In other embodiments, the electrode structure may be provided in plural; and the electrode separating pattern may be disposed between the electrode structures adjacent to each other.

In still other embodiments, the semiconductor memory device may further include: a dopant region disposed in the substrate. In this case, the electrode separating pattern may be in contact with the dopant region. In even other embodiments, the bottom surface of the electrode separating pattern may have a radius of curvature which is greater than a half of a width of the electrode separating pattern and smaller than the width of the electrode separating pattern. In yet other embodiments, the semiconductor pattern may include: a spacer penetrating the electrode structure and having a hollow cylindrical shape; and a body portion disposed in the spacer and being in contact with the substrate.

According to additional embodiments of the invention, a method for manufacturing a three-dimensional (3D) semiconductor memory device may include: forming a stack structure including insulating layers and sacrificial layers which are alternately and repeatedly stacked on a substrate; forming vertical structures penetrating the stack structure;

forming a trench penetrating the stack structure and exposing the substrate; removing the sacrificial layers exposed by the trench to form recess regions; etching the substrate exposed by the trench to form a bottom surface having a rounded profile of the trench; forming horizontal structures filling the recess regions, respectively; and forming an electrode separating pattern filling the trench.

In some of these embodiments, the bottom surface of the trench may be lower than a top surface of the substrate under the stack structure. In other embodiments, etching the substrate exposed by the trench to form the bottom surface having a rounded profile of the trench may include: performing an etching process using $Cl_2$ gas. In still other embodiments, forming the horizontal structures may include: sequentially forming a horizontal layer and a conductive layer covering inner surfaces of the recess regions; and removing the conductive layer disposed in the trench. In even other embodiments, the conductive layer may partially fill the trench and define an empty region a center region of the trench before the conductive layer disposed in the trench is removed.

In yet other embodiments, a thickness of the conductive layer from a center of the bottom surface of the trench to the empty region may be substantially equal to a thickness of the conductive layer from a corner portion of the bottom surface of the trench to the empty region. In yet still other embodiments, the conductive layer disposed in the trench may be removed by an isotropic etching process. In further embodiments, the method may further include: forming upper plugs on the vertical structures, respectively; and forming upper interconnections on the upper plugs.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
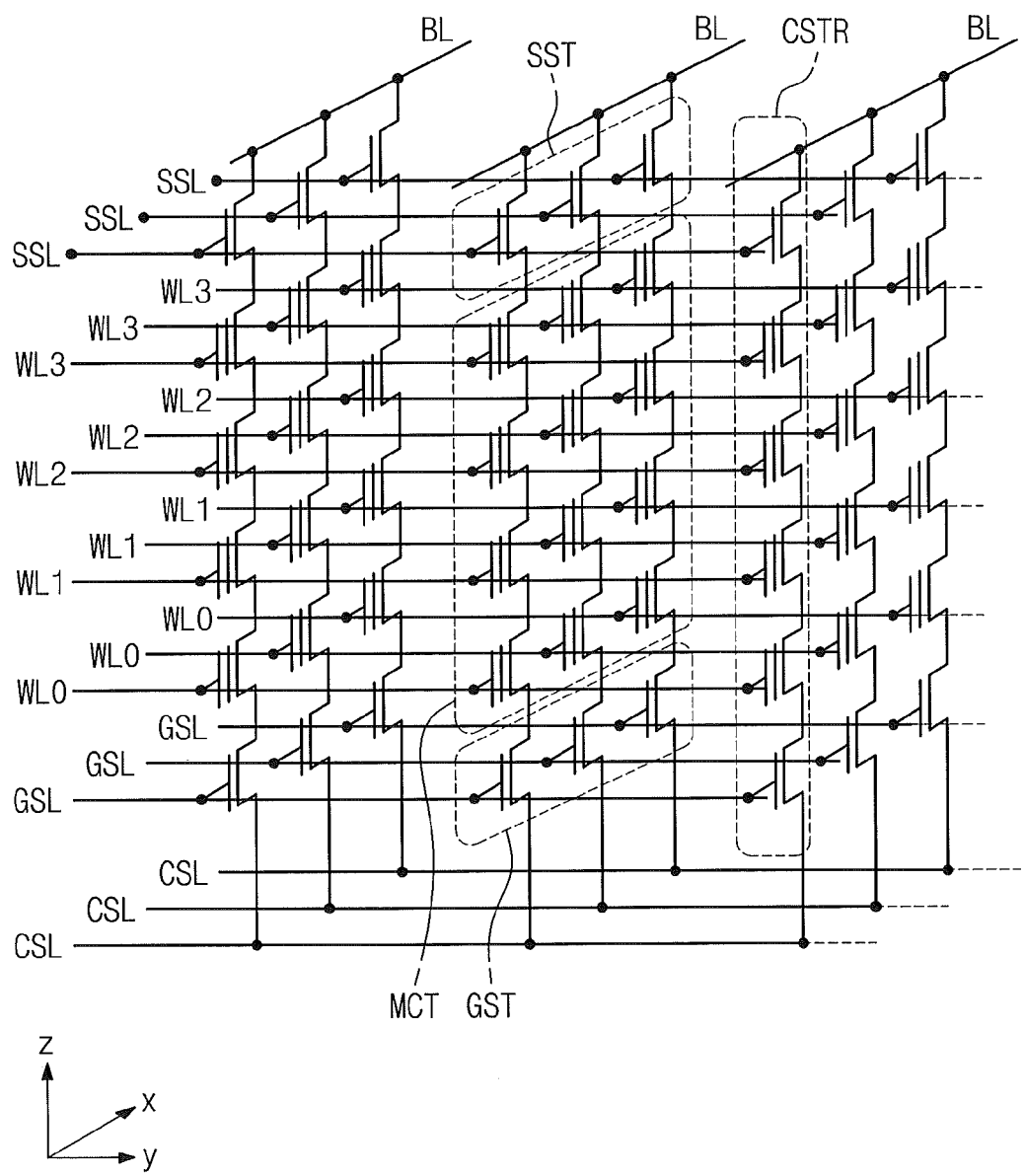
FIG. 1 is a schematic circuit diagram illustrating a three-dimensional (3D) semiconductor memory device according to embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

According to embodiments of the inventive concept, a three-dimensional (3D) semiconductor memory device may include a cell array region, a peripheral circuit region, and a connection region. A plurality of memory cells, a plurality of bit lines, and a plurality of word lines are disposed in the cell array region. The bit lines and the word lines are provided to be electrically connected to the memory cells. Peripheral circuits may be formed in the peripheral circuit region. The peripheral circuits may drive the memory cells and read data stored in the memory cells. In more detail, a word line driver, a sense amplifier, a row decoder, a column decoder, and controlling circuit may be disposed in the peripheral circuit region. A connection region may be disposed between the cell array region and the peripheral circuit region. An interconnection structure may be disposed in the connection region. The interconnection structure may connect the word lines to the peripheral circuits.

FIG. 1 is a schematic circuit diagram illustrating a three-dimensional (3D) semiconductor memory device according to embodiments of the inventive concept. Referring to FIG. 1, a cell array of a 3D semiconductor memory device according to some embodiments may include a common source line CSL, a plurality of bit lines BL, and a plurality of cell strings CSTR disposed between the common source line CSL and the bit lines BL. The bit lines BL may be two-dimensionally arranged in a plan view. A plurality of cell strings CSTR may be connected in parallel to each of the bit lines BL. The cell strings CSTR may be connected in common to the common source line CSL. In other words, a plurality of the cell strings CSTR may be disposed between one common source line CSL and a plurality of the bit lines BL. In some embodiments, the common source line CSL may be provided in plural and the plurality of common source lines CSL may be two-dimensionally arranged in a plan view. Here, the common source lines CSL may be applied with the same voltage, or the common source lines CSL may be electrically controlled independently from each other.

Each of the cell strings CSTR may include a ground selection transistor GST connected to the common source line CSL, a string selection transistor SST connected to the bit line BL, and a plurality of memory cell transistors MCT disposed between the ground and string selection transistors GST and SST. The ground selection transistor GST, the memory cell transistors MCT, and the string selection transistor SST may be connected in series to each other. The cell string CSTR may include a plurality of the ground selection transistors GST connected in series to each other and/or a plurality of the string selection transistors SST connected to in series to each other.

The common source line CSL may be connected in parallel to sources of the ground selection transistors GST. Additionally, a ground selection line GSL, a plurality of word lines WL0 to WL3, and a string selection line SSL, which are disposed between the common source line CSL and the bit lines BL, may be used as gate electrodes of the ground selection transistor GST, the memory cell transistors MCT, and the string selection transistor SST, respectively. Each of memory cell transistors MCT includes a memory element.

Hereinafter, a method for manufacturing a 3D semiconductor memory device according to embodiments of the inventive concept will be described with reference to the drawings and then features of the 3D semiconductor memory device obtained by the method will described in detail.

Figure 6:
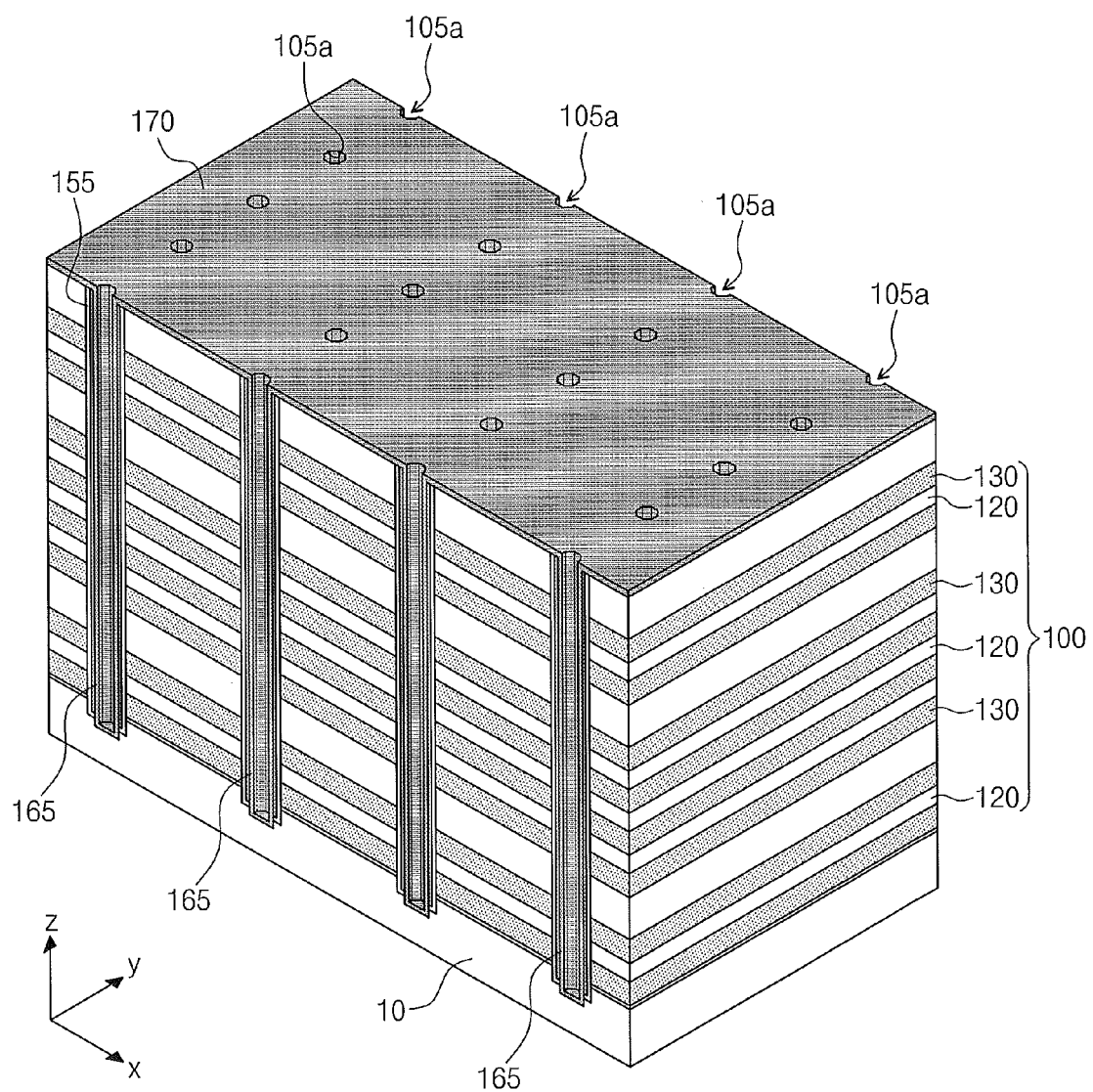
Figure 7:
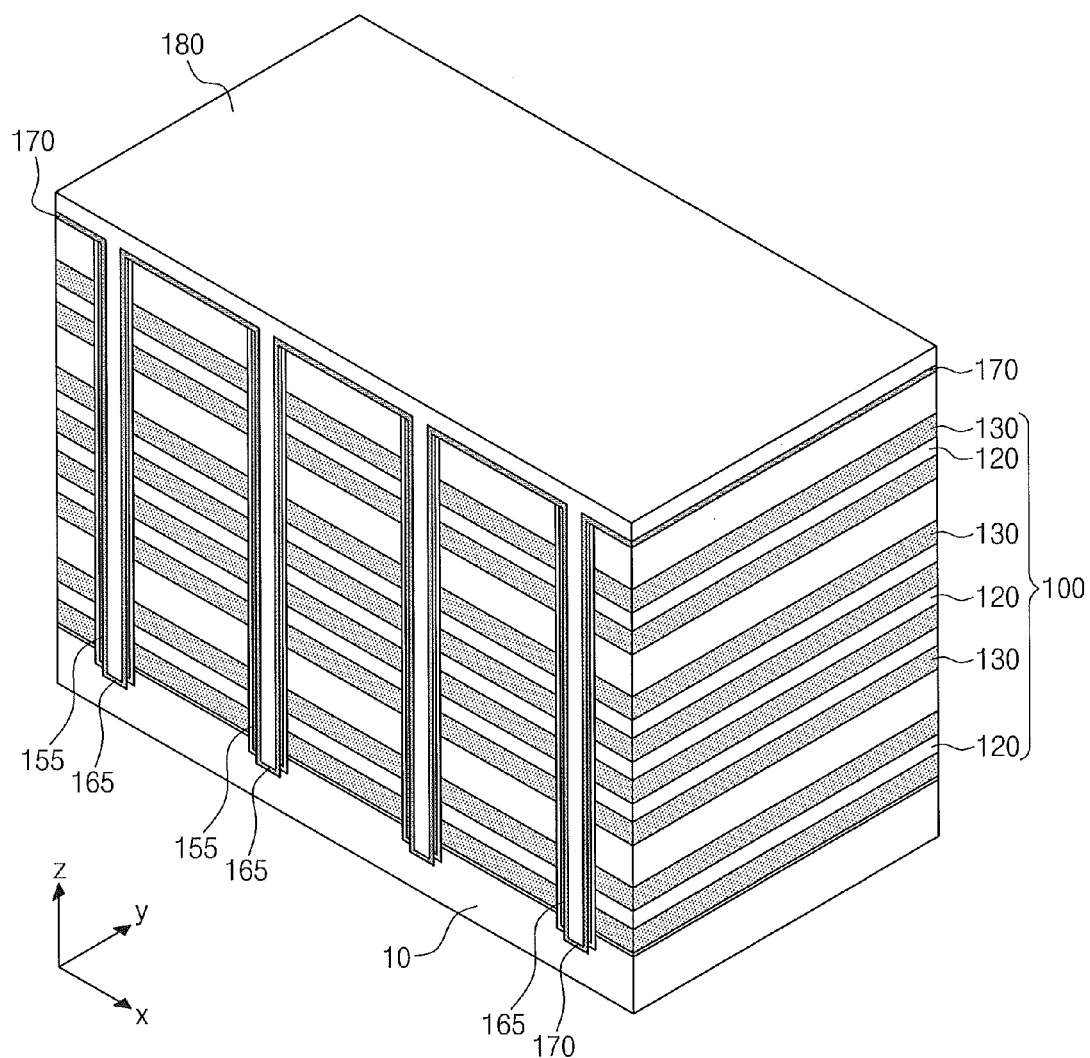
Figure 8A:
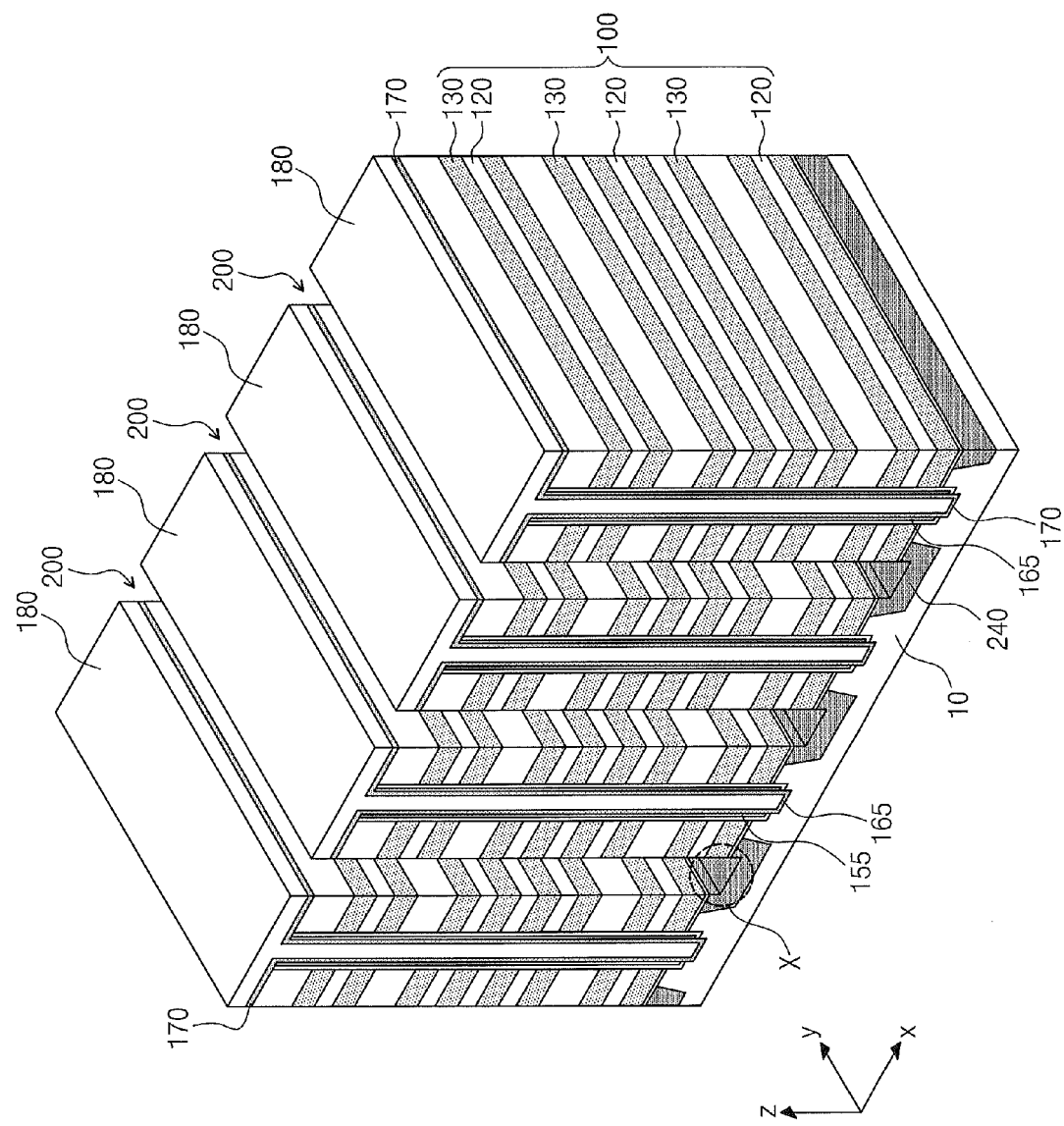
Figure 8B:
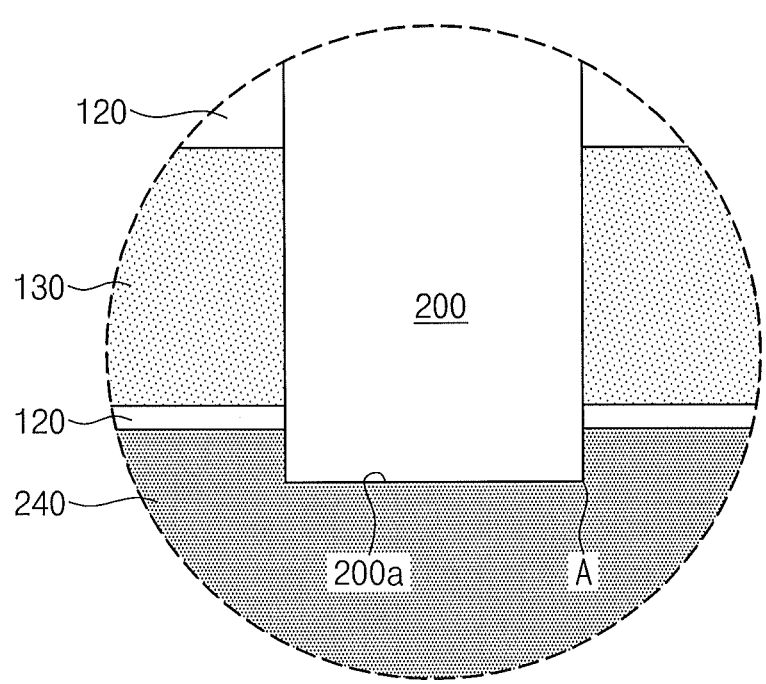
FIG. 8B is an enlarged cross-sectional view of a portion X of FIG. 8A.

FIGS. 2 to 7, 8A, 9, 10A, 11, 16, and 17 are perspective views illustrating a method for manufacturing a 3D semiconductor memory device according to some embodiments of the inventive concept. FIG. 8B is an enlarged cross-sectional view of a portion X of FIG. 8A, and FIG. 10B is an enlarged cross-sectional view of a portion Y of FIG. 10A.

Figure 2:
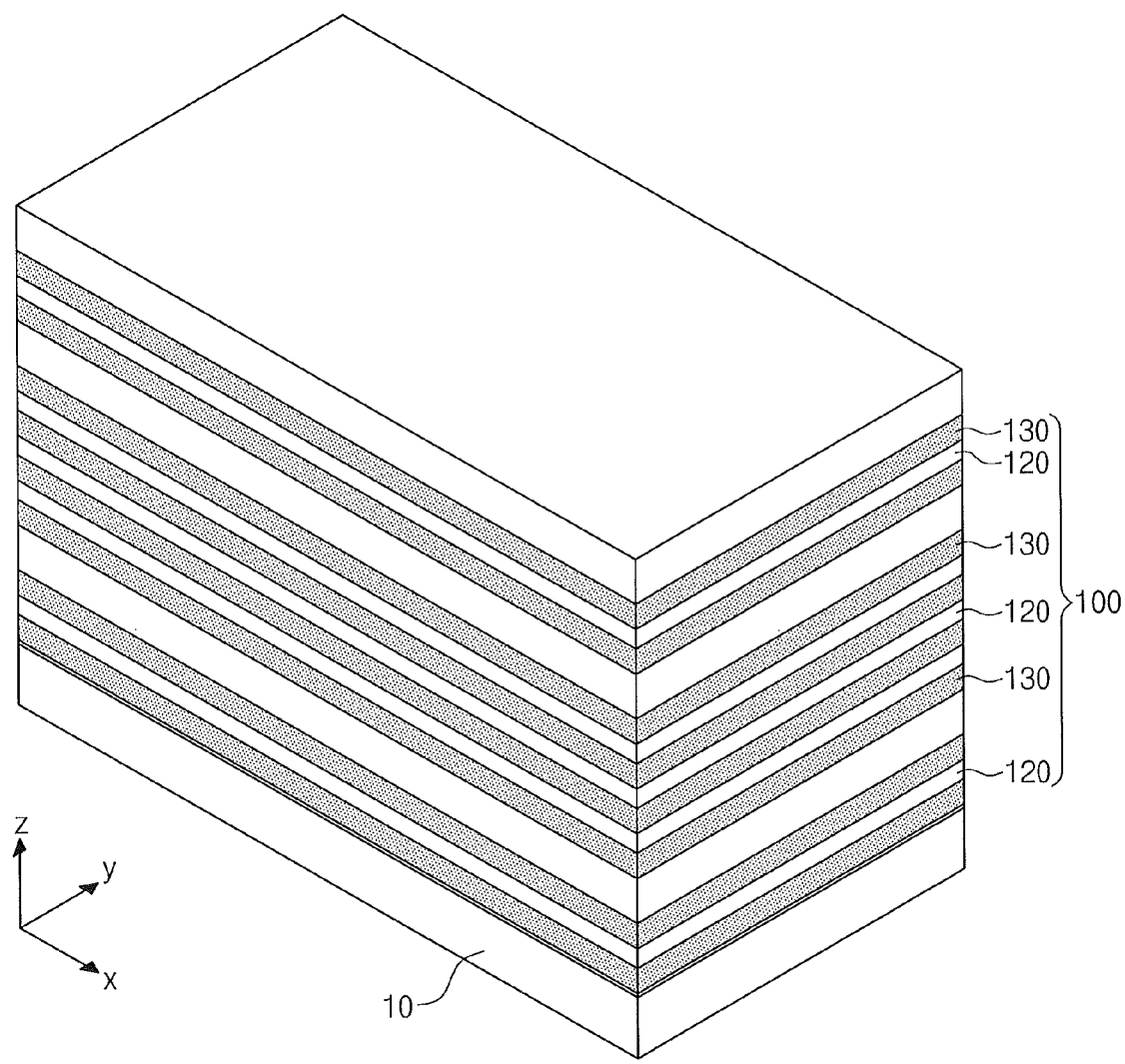
FIGS. 2 to 7, 8A, 9, 10A, 11A, 16, and 17 are perspective views illustrating a method for manufacturing a 3D semiconductor memory device according to some embodiments of the inventive concept.

Referring to FIG. 2, a stack structure 100 may be formed on a substrate 10. The substrate 10 may include one of materials having semiconductor properties, insulating materials, a semiconductor material covered by an insulating material, and a conductive material covered by an insulating material. For example, the substrate 10 may be a silicon wafer. Even though not shown in the drawings, a lower structure including at least one transistor may be disposed between the substrate 10 and the stack structure 100.

The stack structure 100 may include a plurality of insulating layers 120 and a plurality of sacrificial layers 130. The insulating layers 120 and the sacrificial layers 130 may be alternately and repeatedly stacked as illustrated in FIG. 2. The sacrificial layers 130 may be formed of a material having an etch selectivity with respect to the insulating layers 120. In other words, in a process for etching the sacrificial layers 130 using a predetermined etch recipe, the sacrificial layers 130 may be etched, but the insulating layers 120 may be hardly etched. The etch selectivity may be quantitatively expressed by a ratio of an etch-rate of the sacrificial layer 130 to an etch-rate of the insulating layer 120. For example, the ratio of the etch-rate of the sacrificial layer 130 to the etch-rate of the insulating layer 120 may have a range of about 10:1 to about 200:1.

The insulating layers 120 may be formed of at least one of a silicon oxide layer and a silicon nitride layer. The sacrificial layer 130 may be formed of a material which is different from that of the insulating layer 120 and is selected from a group consisting of a silicon layer, a silicon oxide layer, a silicon carbide layer, and a silicon nitride layer. Hereinafter, the insulating layers 120 of silicon oxide layers and the sacrificial layers 130 of silicon nitride layers will be described as an example for the purpose of ease and convenience in explanation.

In some embodiments, thicknesses of the sacrificial layers 130 may be substantially equal to each other. Alternatively, thicknesses of the insulating layers 120 may not be equal to each other. For example, the lowermost insulating layer of the insulating layers 120 may be thinner than each of the sacrificial layers 130. Each of the third insulating layer from the lowermost insulating layer and the third insulating layer from the uppermost layer in the stacked insulating layers 120 may be thicker than each of the sacrificial layers 130. The others of the stacked insulating layers 120 may be thinner or thicker than each of the sacrificial layers 130. The lowermost insulating layer may have the thinnest thickness in the insulating layers 120 included in the stack structure 100. For example, the lowermost insulating layer may have a thickness within a range of about 10□ to 100□. The lowermost insulating layer may be a silicon oxide layer formed by a thermal oxidation process and may reduce defects on a surface of the substrate 10 and/or a stress between the stack structure 100 and the substrate 10. The thicknesses of the insulating layers 120 may be variously changed, and the number of the layers constituting the stack structure 100 may also be variously changed.

Figure 3:
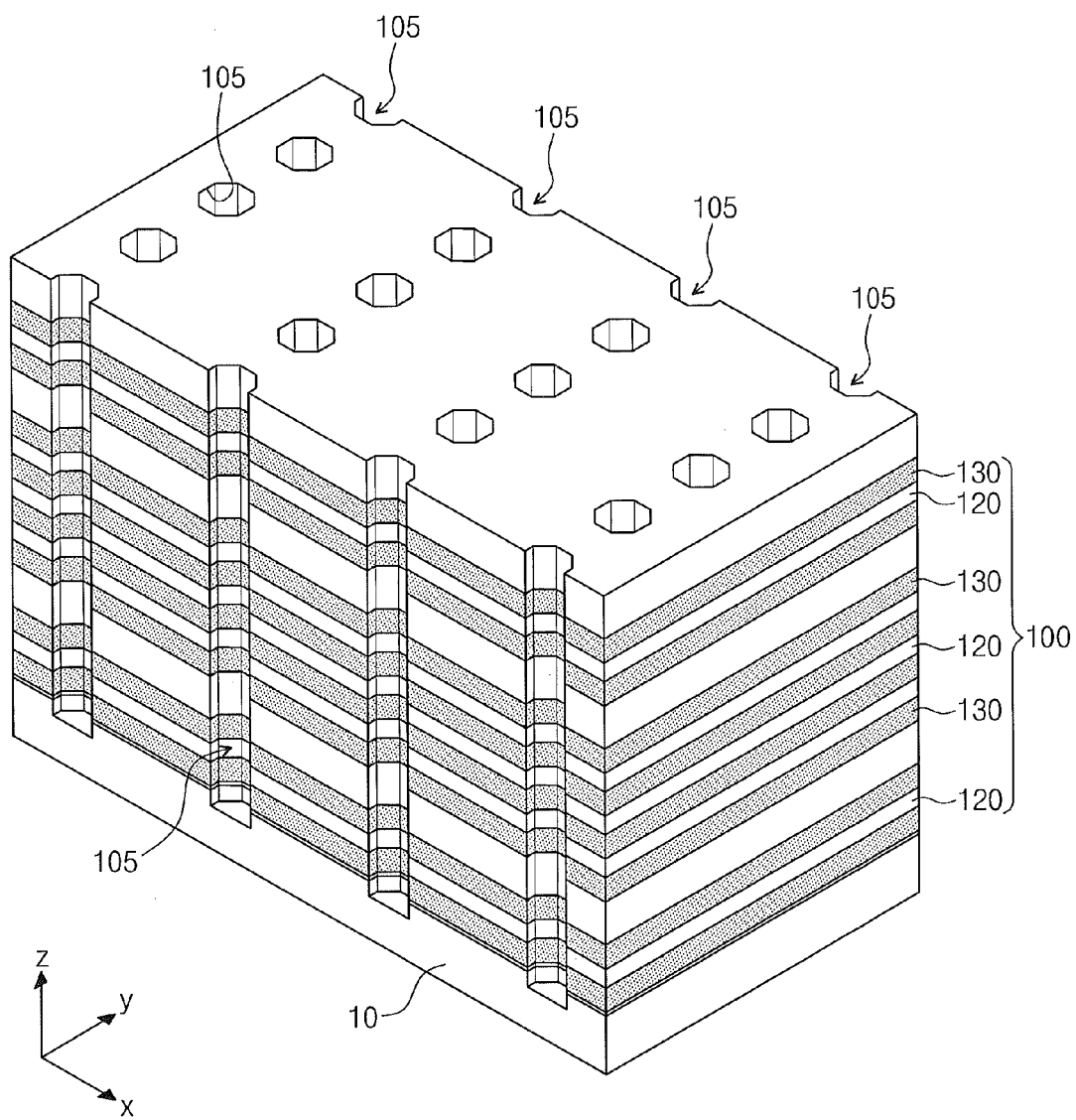

Referring to FIG. 3, openings 105 are formed to penetrate the stack structure 100.

Each of the openings 105 may be formed to have a hole-shape. Each of the openings 105 may have a depth which may be 5 times or more greater than a width of each of the openings 105. The openings 105 may be two-dimensionally arranged in a plan view (e.g., in a xy plane). That is, the openings 105 may be spaced apart from each other in an x-axis direction and in a y-axis direction. The openings 105 may be arranged along rows parallel to the x-axis direction and columns parallel to the y-axis direction. The openings 105 constituting each of the columns may be arranged in a line along the y-axis direction as illustrated in FIG. 3. Alternatively, the openings 105 constituting each of the columns may be arranged in zigzag form in the y-axis direction.

Forming the openings 105 may include forming a mask pattern (not shown) defining the openings 105 on the stack structure 100; and anisotropically etching the stack structure 100 using the mask pattern as an etch mask. The openings 105 formed by the etching process may expose a top surface of the substrate 100. Additionally, as illustrated in FIG. 3, the substrate 10 exposed by the openings 105 may be over-etched to be recessed by a predetermined depth. However, the inventive concept is not limited thereto.

Sidewalls of the openings 105 may be formed to be substantially vertical to the top surface of the substrate 10. Alternatively, sidewalls of the openings 105 may not be completely vertical to the top surface of the substrate 10. Since the stack structure 100 includes at least two kinds of different layers having etch-rates different from each other, a width of the opening 105 may become less toward the top surface of the substrate 10.

Figure 4:
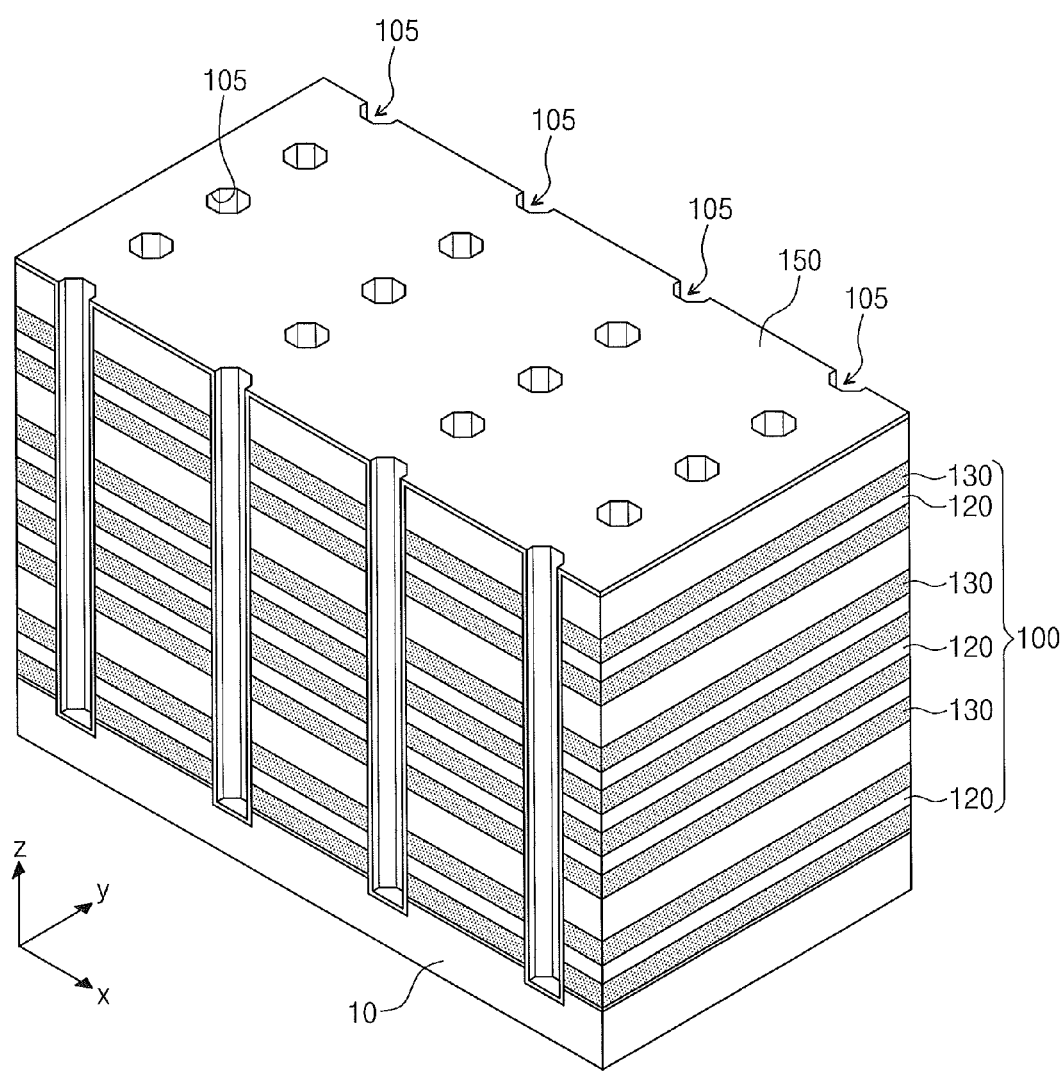

Referring to FIG. 4, a vertical layer 150 may be formed to conformally cover the stack structure 100 in which the openings 105 are formed. The vertical layer 150 may consist of one or more thin layers. For example, the vertical layer 150 may include at least one of thin layers used as a memory element of a charge trap type non-volatile memory transistor. Embodiments of the inventive concept may be variously realized depending on thin layers constituting the vertical layer 150, and the variously realized embodiments will be described with reference to FIGS. 18 to 25 in detail later.

Next, a first semiconductor layer (not shown) may be formed on the vertical layer 150, so as to conformally cover inner sidewalls of the openings 105.

Figure 5:
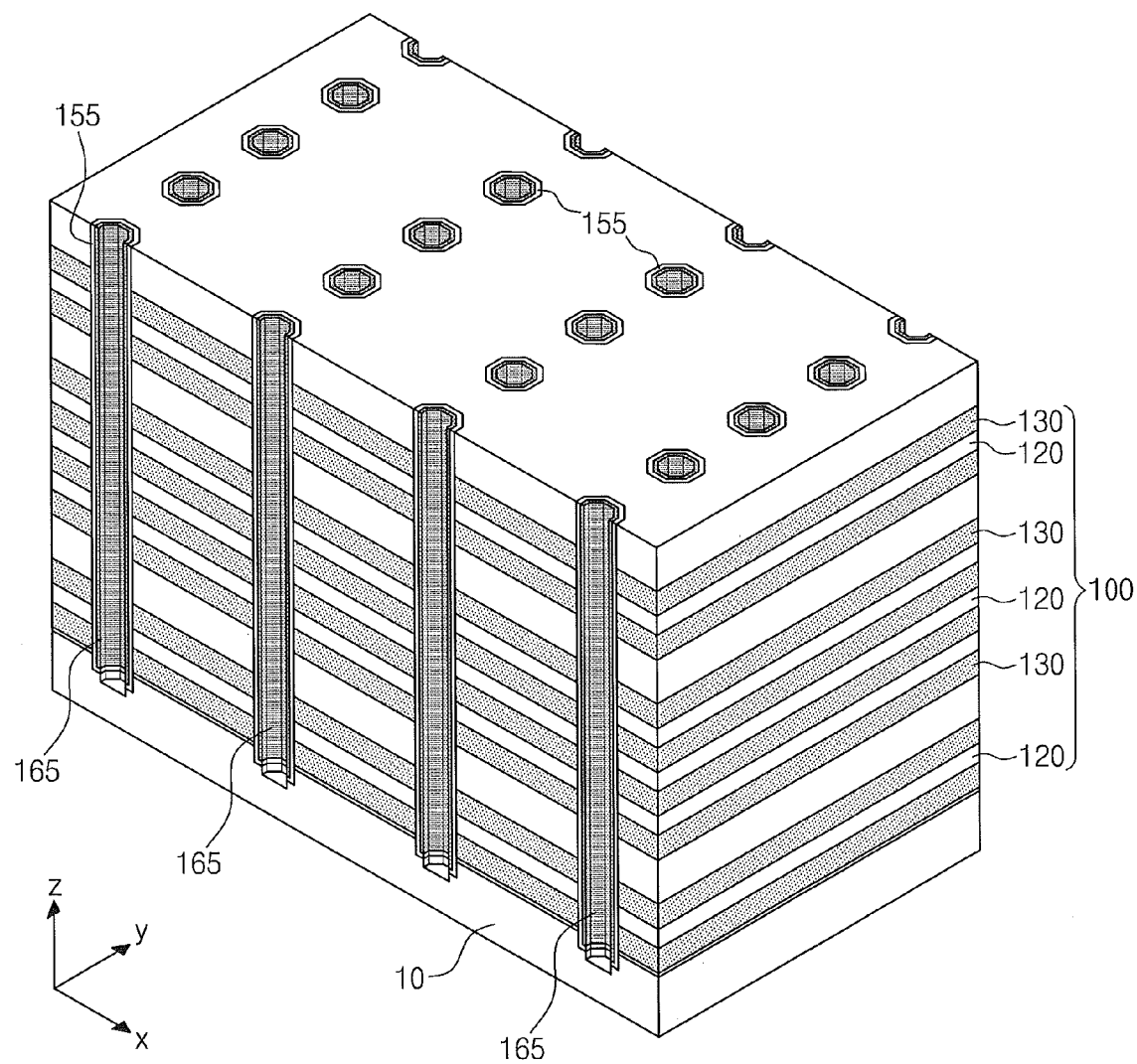

Referring to FIG. 5, the first semiconductor layer may be anisotropically etched to form a semiconductor spacer 165 covering the vertical layer 150 of FIG. 4 on the inner sidewall of each of the openings 105. Subsequently, the vertical layer 150 of FIG. 4 may be anisotropically etched using the semiconductor spacer 165 as an etch mask. Thus, a vertical pattern 155 may be formed to have a cylindrical shape of which both ends are opened. At this time, it is possible to reduce damage of the vertical pattern 155 by the semiconductor spacer 165 used as the etch mask. The top surface of the stack structure 100 may be exposed by etching the vertical layer 150. The semiconductor spacer 165 may have a hollow cylindrical shape.

The sum of thicknesses of the vertical pattern 155 and the semiconductor spacer 165 deposited on the inner sidewall of the opening 105 of FIG. 3 may be smaller than a half of a width of opening 105 of FIG. 3. That is, the opening 105 of FIG. 3 may be partially filled with the vertical pattern 155 and the semiconductor spacer 165.

The top surface of the substrate 100 under the openings 105 may be recessed by over-etching of the process for forming the vertical pattern 155 as illustrated in FIG. 5. A portion of the vertical layer 150 of FIG. 4 disposed under the semiconductor spacer 165 may not be etched. In this case, the vertical pattern 155 may have a bottom portion disposed between a bottom surface of the semiconductor spacer 165 and the substrate 10.

Referring to FIG. 6, a second semiconductor layer 170 may be formed in the openings 105 having the vertical patterns 155 and the semiconductor spacers 165. The second semiconductor layer 170 may be conformally formed in the openings 105. In other words, the second semiconductor layer 170 may not completely fill the openings 105. The second semiconductor layer 170 may define pin-holes 105a in the openings 105, respectively. That is, the second semiconductor layer 170 may be formed to have a pipe-shape, a hollow cylindrical shape, or a cup-shape.

The first and second semiconductor layers may be formed of, for example, silicon (Si), germanium (Ge), or any combination thereof. The first and second semiconductor layers may be formed of an intrinsic semiconductor material not doped with dopants or a semiconductor material doped with dopants. The first and second semiconductor layers may be in a single-crystalline state, an amorphous state, or a poly-crystalline state. The first and second semiconductor layers may be formed in the openings by an atomic layer deposition (ALD) process or a chemical vapor deposition (CVD) process. Alternatively, the first and second semiconductor layers may be formed by a selective epitaxial growth (SEG) process using the substrate 10 exposed by the openings as a seed layer.

Referring to FIG. 7, a filling insulating layer 180 may be formed to fill the pin-holes 105a. In other words, the filling insulating layer 180 may be formed to fill empty regions defined by the second semiconductor layer 170 in the openings. The filling insulating layer 180 may be formed of one of a silicon oxide layer and insulating materials formed using a spin-on-glass (SOG) technique. In some embodiments, before the filling insulating layer 180 is formed, a hydrogen annealing process may be further performed on the second semiconductor layer 170 under a gas atmosphere including hydrogen or heavy hydrogen. Thus, crystal defects in the second semiconductor layer 170 and the semiconductor spacer 165 may be cured by the hydrogen annealing process.

In a modified embodiment, the second semiconductor layer 170 may completely fill the openings in which the vertical patterns 155 and the semiconductor spacers 165 are formed. In this case, the filling insulating layer 180 may be omitted.

The second semiconductor layer 170 and the filling insulating layer 180 may be respectively formed into a semiconductor body portion 175 of FIG. 16 and a filling insulating pattern 185 of FIG. 16 by a planarization process which will be described with reference to FIG. 16. Thus, a vertical structure VS of FIG. 16 may be formed. The vertical structure VS may include the vertical pattern 155, the semiconductor spacer 165, the semiconductor body portion 175 of FIG. 16, the filling insulating pattern 185 of FIG. 16. The vertical structure VS will be described with reference to FIG. 16 in more detail later.

Referring to FIGS. 8A and 8B, trenches 200 may be formed to penetrate the stack structure 100. The trenches 200 expose sidewalls of the sacrificial layers 130 and the insulating layers 120. The trenches 200 may be spaced apart from the openings 105 of FIG. 3 and cross between the openings 105 of FIG. 3.

In some embodiments, a pair of the trenches 200 may be disposed at both sides of each of the openings 105 of FIG. 3, respectively.

Forming the trenches 200 may include forming an etch mask on the stack structure 100; and anisotropically etching the stack structure 100 using the etch mask until the top surface of the substrate 10 is exposed. At this time, the substrate 10 under the trenches 200 may be recessed by a predetermined depth due to the over-etching of the anisotropic etching as illustrated in FIGS. 8A and 8B. In other words, a bottom surface 200a of the trench 200 may be formed to be lower than the top surface of the substrate 100 under a remaining stack structure 100.

Sidewalls of the trenches 200 may be substantially vertical to the top surface of the substrate 10 as illustrated in FIGS. 8A and 8B. Alternatively, the sidewalls of the trenches 200 may not be completely vertical to the top surface of the substrate 10. Since the stack structure 100 includes at least two kinds of different layers having etch-rates different from each other, a width of the trench 200 may become less toward the top surface of the substrate 10.

A lower region of the trench 200 formed by the anisotropic etching process may have an angulated shape. In other words, a corner portion A of the trench 200, at which the bottom surface 200a of the trench 200 meets a sidewall of the trench 200, may have an angulated profile.

Dopant regions 240 may be formed in the substrate 10. The dopant regions 240 may be formed in the substrate 10 under the trenches 200, respectively. The dopant regions 240 may be formed by an ion implantation process using, for example, at least one of arsenic (As), phosphorus (P), nitrogen ($N_2$), and argon (Ar). In other embodiments, the dopant regions 240 may be formed in step of FIG. 11. This will be described with reference to FIG. 11 in detail later.

The dopant regions 240 may have a conductivity type different from that of dopants of the substrate 10. A region (a contact region, not shown) of the substrate 10 contacting the second semiconductor layer 170 may have the same conductivity type as the substrate 10. The dopants regions 240 may constitute a PN-junction in company with the substrate 10 or the second semiconductor layer 170.

In some embodiments, the dopants regions 240 may be connected to each other, so as to be in an equipotential state. In other embodiments, the dopant regions 240 may be electrically separated from each other to have potentials different from each other, respectively. In still other embodiments, the dopant regions 240 may be classified into a plurality source groups. Each of the source groups may include a plurality of the dopant regions 240. The source groups may be electrically separated from each other to have potentials different from each other, respectively.

Figure 9:
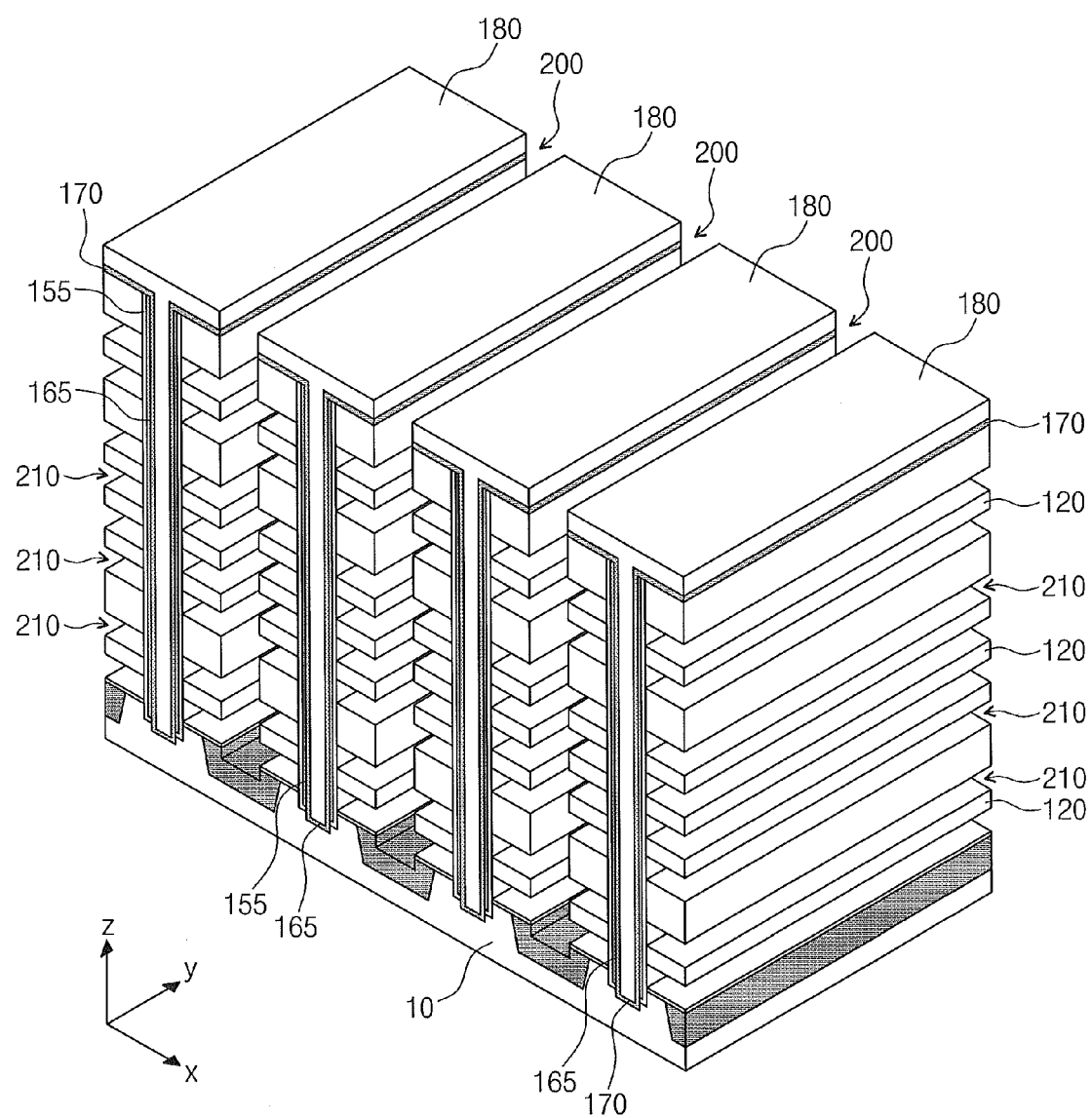

Referring to FIG. 9, the sacrificial layers 130 exposed by the trenches 200 may be removed to form recess regions 210 between the insulating layers 120. Forming the recess regions 210 may include laterally etching the sacrificial layers 130 using an etch recipe having an etch selectivity between the insulating layers 120 and the sacrificial layers 130. For example, if the sacrificial layers 130 are formed of silicon nitride layers and the insulating layers 120 are formed of silicon oxide layers, the sacrificial layers 130 may be etched using an etch solution including phosphoric acid.

The recess regions 210 may horizontally extend from the trenches 200 to spaces between the insulating layers 120. The recess regions 210 may expose portions of sidewalls of the vertical patterns 155. Vertical heights (i.e., lengths in a z-axis direction) of the recess regions 210 may be determined depending on the deposition thicknesses of the sacrificial layers 130 described with reference to FIG. 2.

Figure 10A:
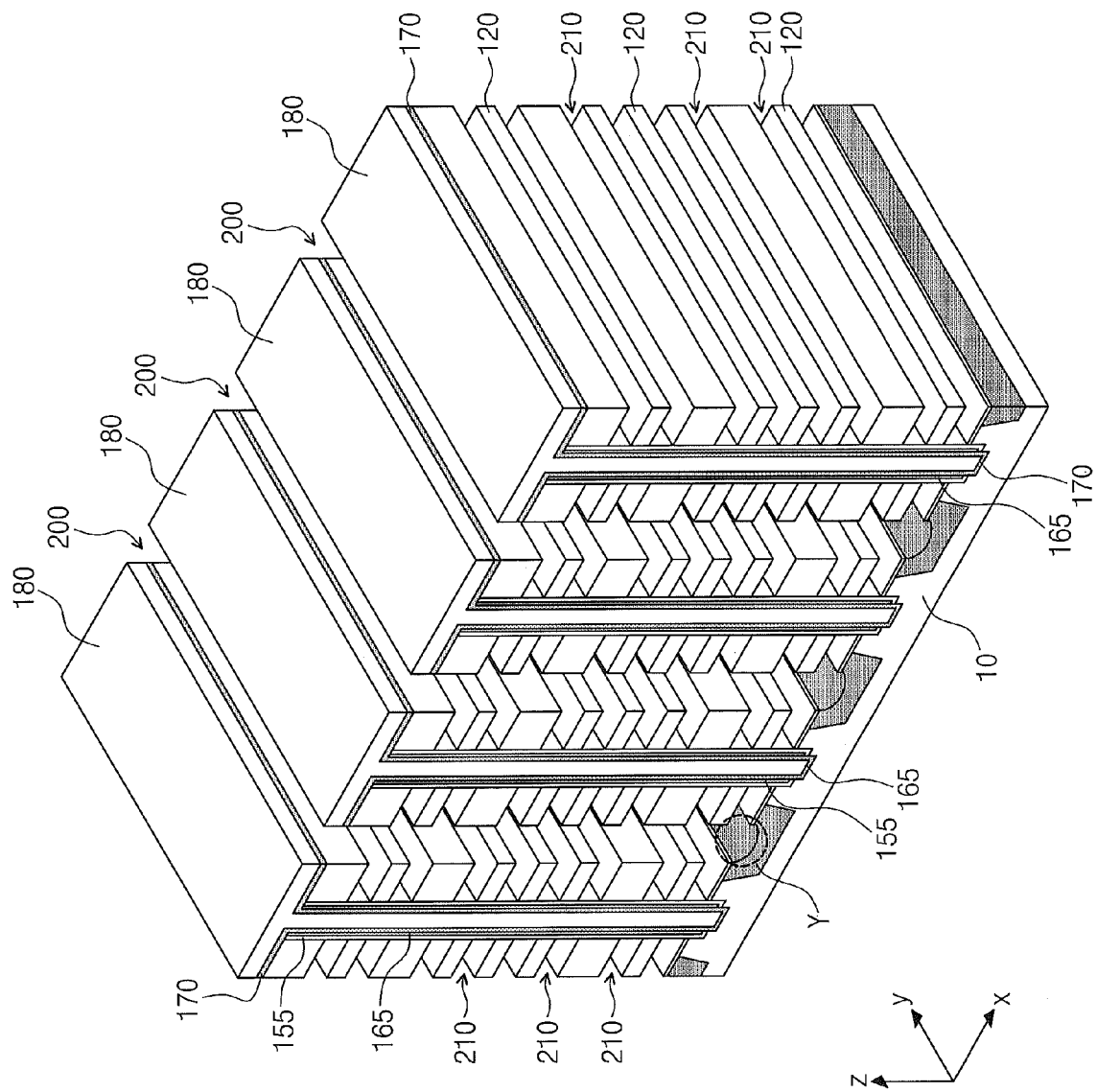
Figure 10B:
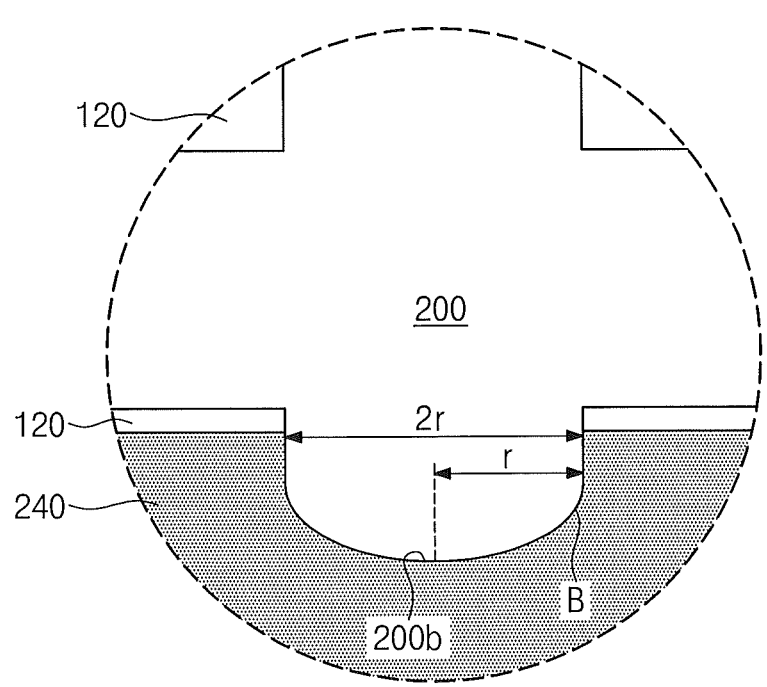
FIG. 10B is an enlarged cross-sectional view of a portion Y of FIG. 10A.

Referring to FIGS. 10A and 10B, the portions of the substrate 10 exposed by the trenches 200 may be further etched, so that the bottom surfaces 200b of the trenches 200 may have rounded profiles. In other words, the top surface of the substrate 10 exposed by the trenches 200 may be additionally etched. The etching process may include a dry etching process and/or a wet etching process. In some embodiments, the etching process may be the dry etching process using a gas capable of minimizing damage of the insulating layers 120, for example, $Cl_2$ gas. In other embodiments, the etching process may be a gas phase etching process using a chemical reaction generated by thermal energy without plasma.

The lower regions of the trenches 200 may be further recessed within the substrate 10. In other words, the lower regions of the trenches 200 may be enlarged within the substrate 10. The bottom surface 200b of each of the trenches 200 may have curvature. For example, the bottom surface 200b of the trench 200 may have the curvature greater than the reciprocal of the width of the trench 200 and smaller than the reciprocal of a half of the width of the trench 200. If the width of the trench 200 is 2r, the curvature of the bottom surface 200b may be greater than ½r and smaller than 1/r. In other words, the bottom surface 200b of the trench 200 may have the radius of curvature which is greater than the half (r) of the width of the trench 200 and smaller than the width (2r) of the trench 200. That is, the bottom surface 200b may have the radius of curvature which is greater than that of a circle having a diameter equal to the width of the trench 200 and smaller than that of a circle having a radius equal to the width of the trench 200.

The bottom surface 200b of the trench 200 may not be parallel to the top surface of the substrate 10. The bottom surface 200b of the trench 200 may have a downwardly convex shape. A corner portion B at which the bottom surface 200b meets the sidewall of the trench 200 may be rounded. As a result, the bottom surface 200b of the trench 200 may have a rounded profile.

Figure 11A:
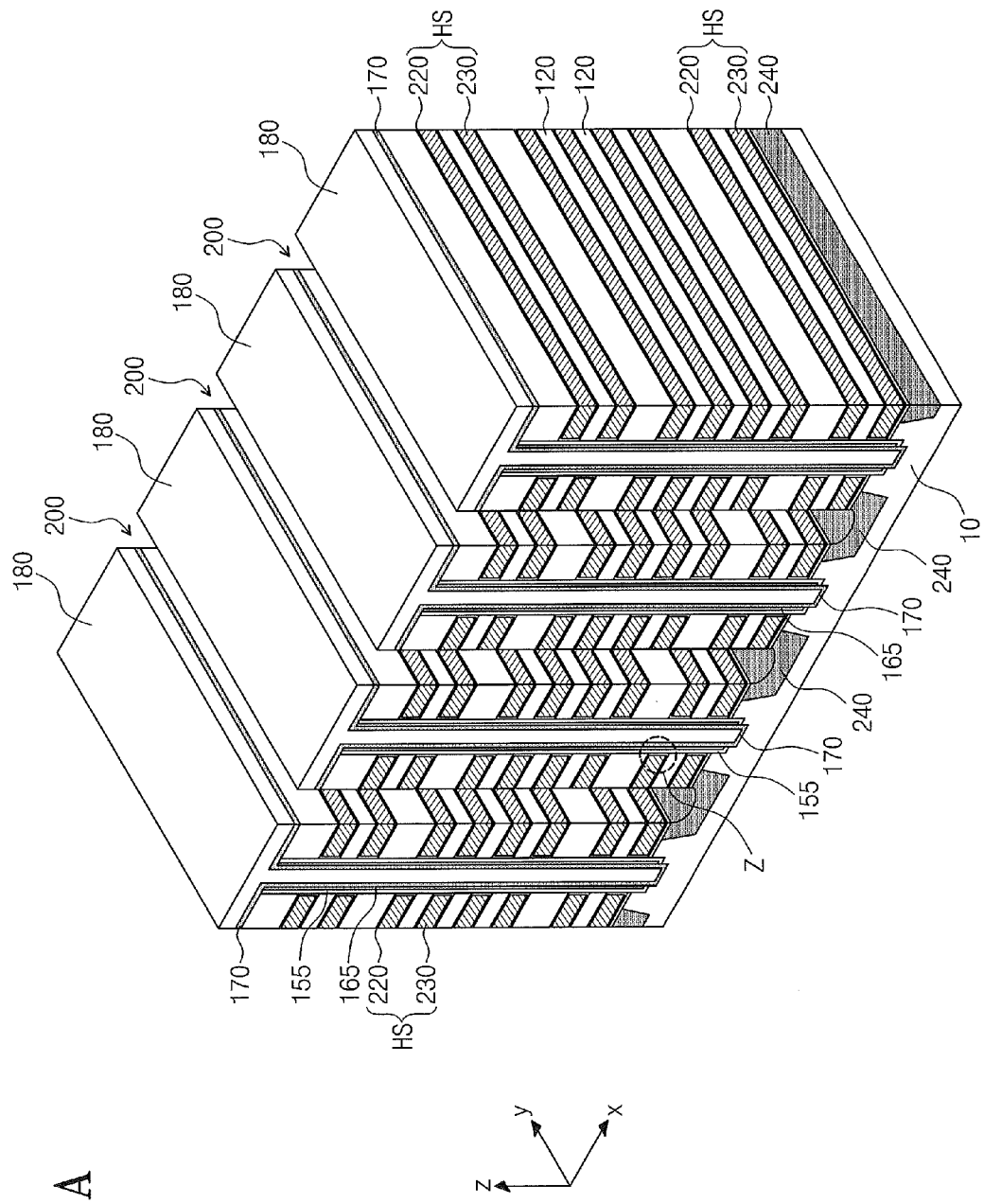
Figure 11B:
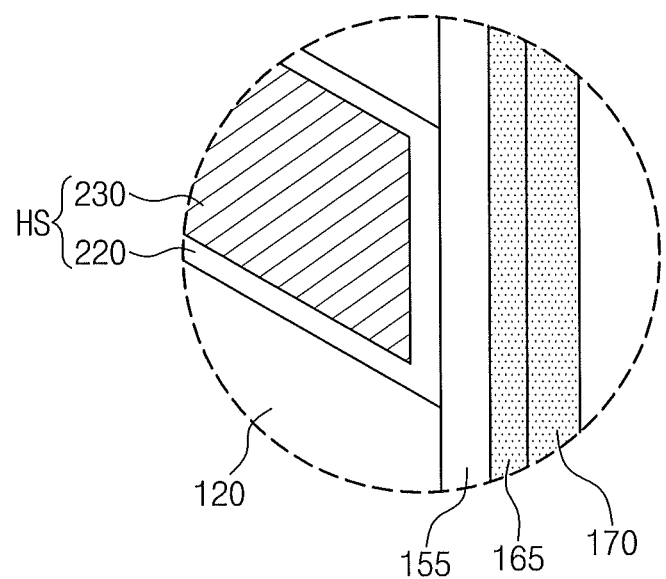
FIG. 11B is an enlarged cross-sectional view of a portion Z of FIG. 11A.

Referring to FIGS. 11A and 11B, horizontal structures HS may be formed to fill the recess regions 210, respectively. Each of the horizontal structures HS may include a horizontal pattern 220 covering an inner surface of each of the recess regions 210 and a conductive pattern 230 filling the rest space of each of the recess regions 210. The conductive patterns 230 may be formed, such that electrode structures may be formed on the substrate 100. Each of the electrode structures may include the conductive patterns 230 and insulating patterns 120 which are alternately and repeatedly stacked on the substrate 10. Each of the electrode structure may be disposed between the trenches 200 adjacent to each other.

The horizontal pattern 220 may consist of one or more thin layers. In some embodiments, the horizontal pattern 220 may include a blocking dielectric layer of the charge trap type non-volatile memory transistor. However, the inventive concept is not limited thereto. As described above, embodiments of the inventive concept may be variously realized depending on a layer constituting each of the vertical pattern 155 and the horizontal pattern 220. The variously realized embodiments will be described with reference to FIGS. 18 to 25 in detail later.

The conductive patterns 230 may include at least one of doped silicon, metal materials, metal nitrides, and metal silicides. For example, the conductive patterns 230 may include tantalum nitride and/or tungsten.

Forming the horizontal structures HS may include sequentially forming a horizontal layer and a conductive layer to fill the recess regions 210; and removing the conductive layer in the trenches 200 to form the conductive patterns 230 in the recess regions 210, respectively.

In other embodiments, after the horizontal structures HS are formed, the dopant regions 240 of FIG. 9 may be formed. The dopant regions 240 may be formed in the substrate 10 exposed through the trenches 200 by an ion implantation process. The dopant regions 240 may have a conductivity type different from that of the substrate 10. Thus, the dopant regions 240 and the substrate 10 may constitute PN-junctions.

According to the 3D semiconductor memory device of embodiments of the inventive concept, the bottom surface 200b of the trench 200 has the rounded profile. Thus, it is possible to minimize damage of the conductive patterns 230 in the process for filling the recess regions 210 with the horizontal structures HS. The sequence of the process will be described with reference to FIGS. 12 to 15 in more detail.

FIGS. 12 to 15 are cross-sectional views illustrating a formation method described with reference to FIGS. 10A, 10B, and 11 in more detail.

Figure 12:
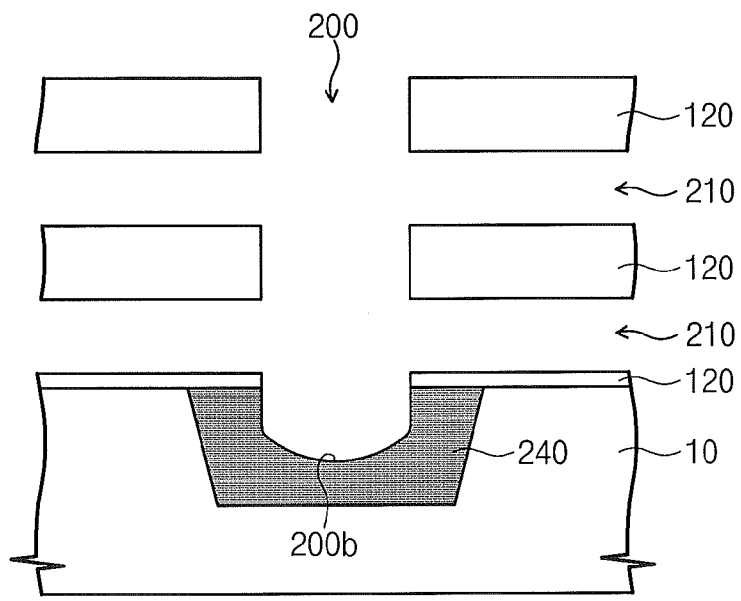
FIGS. 12 to 15 are cross-sectional views illustrating a formation method described with reference to FIGS. 10A, 10B, and 11A in more detail.

Referring to FIG. 12, as described with reference to FIGS. 10A and 10B, the sacrificial layers 130 of FIG. 9 exposed by the trenches 200 may be selectively removed to form the recess regions 210 between the insulating layers 120. Meanwhile, the bottom surface 200b of the trench 200 has the rounded profile by the etching process described with reference to FIG. 9 and is recessed within the substrate 10.

Figure 13:
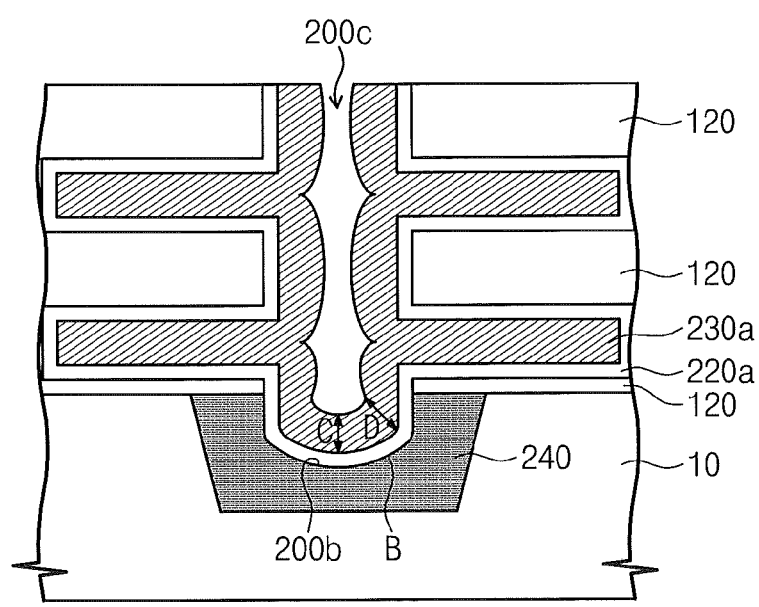

Referring to FIG. 13, the horizontal structures HS of FIG. 11 are formed to fill the recess regions 210, respectively. To achieve this, a horizontal layer 220a may be formed in the recess regions 210. The horizontal layer 220a may be conformally formed along inner surfaces of the recess regions 210 and the bottom surface 200b of the trench 200. Next, a conductive layer 230a may be formed to fill the recess regions 210. The conductive layer 230a may be provided through the trench 200, so as to fill the rest regions of the recess regions 210 having the horizontal layer 220a.

In some embodiments, the conductive layer 230a may be formed using a deposition technique (e.g., a CVD technique or an ALD technique) providing an excellent step coverage property. Thus, the conductive layer 230a may fill the recess regions 210 and be conformally formed in the trench 200.

The trench 200 may be completely or partially filled with the conductive layer 230a. In an embodiment, as illustrated in FIG. 13, if a planar width of the trench 200 is greater than a vertical height of each of the recess regions 210, the conductive layer 230a may partially fill the trench 200 and define an empty region 200c in a center region of the trench 200. In this case, the conductive layer 230a may be formed to have a substantially uniform thickness on the bottom surface 200b having the rounded profile of the trench 200 according to embodiments of the inventive concept. In other words, a thickness C of the conductive layer 230a from a center of the bottom surface 200b to the empty region 200c may be substantially equal to a thickness D of the conductive layer 230a from the corner portion B of the bottom surface 200b to the empty region 200c. Thus, it is possible to reduce a process time of a process removing the conductive layer 230a formed in the trench 200. As a result, it is possible to minimize damage of the conductive layer 230a formed in the recess regions 210.

Figure 14:
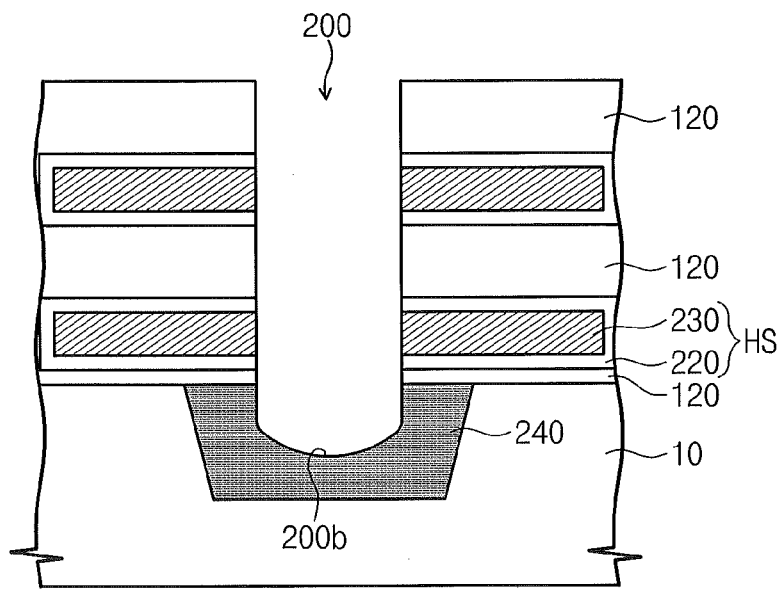

Referring to FIG. 14, the conductive layer 230a of FIG. 13 in the trench 200 may be removed to form horizontal patterns 220 and conductive patterns 230. Forming the horizontal patterns 220 and the conductive patterns 230 may include removing the conductive layer 230a of FIG. 13 in the trench 200 to leave the conductive patterns 230 in the recess regions 210, respectively. Forming the horizontal patterns 220 and the conductive patterns 230 may include removing the conductive layer 230a of FIG. 13 in the trench 200 by an isotropic etching process. Thus, the horizontal structures HS including the horizontal patterns 220 and the conductive patterns 230 may be formed.

Figure 15:
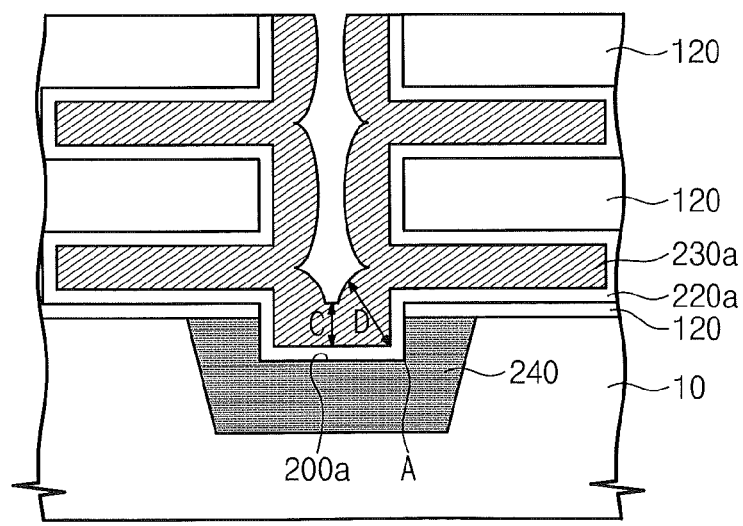

FIG. 15 is a cross-sectional view illustrating a portion of a 3D semiconductor memory device formed by a general technique. Referring to FIG. 15, in the 3D semiconductor memory device formed by the general technique, a bottom surface 200a of a trench 200 is substantially parallel to the top surface of the substrate 10, and a corner portion A at which the bottom surface 200a meets a sidewall of the trench 200 has an angulated shape. Thus, a conductive layer 230a may not be uniformly formed in the trench 200. In other words, a thickness C of the conductive layer 230a from a center of the bottom surface 200a to the empty region defined in the trench 200 may not be equal to a thickness D of the conductive layer 230a from the corner portion A of the bottom surface 200a to the empty region. For example, the thickness D may be greater than the thickness C. Thus, a process time of a subsequent etching process removing the conductive layer 230a in the trench 200 may increase. As a result, the conductive layer 230a in the recess regions 210 may be damaged, such that reliability of the 3D semiconductor memory device may be deteriorated.

However, according to embodiments of the inventive concept, the bottom surface 200b of the trench 200 has the rounded profile, so that the process time of the etching process the conductive layer 230a in the trench 200 may be reduced. As a result, the damage of the conductive layer 230a in the recess regions 210 may be minimized to realize the 3D semiconductor memory device having excellent reliability.

Figure 16:
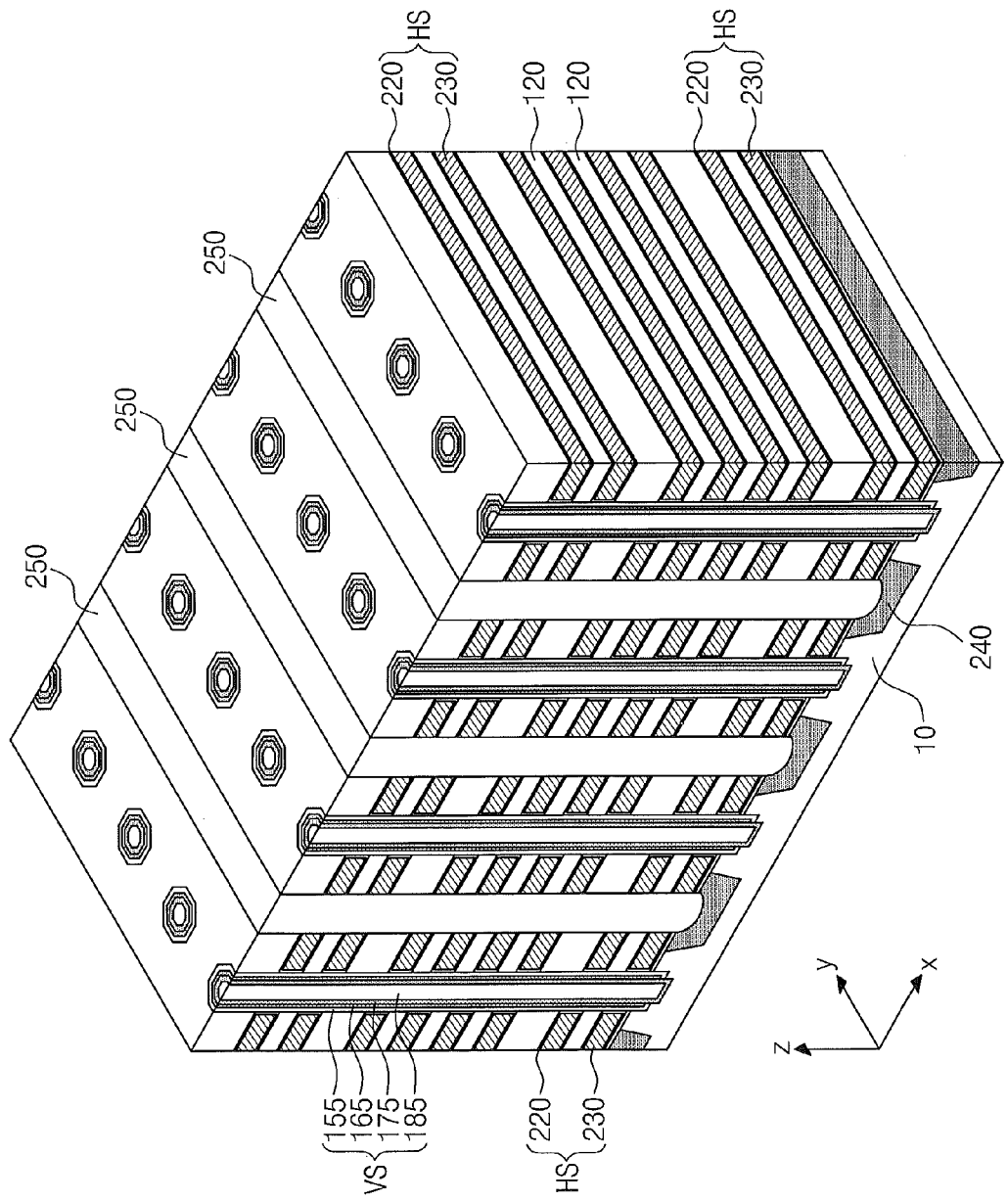

Referring to FIG. 16, electrode separating patterns 250 may be formed to fill the trenches 200, respectively. Each of the electrode separating patterns 250 may be disposed between the electrode structures adjacent to each other.

Forming the electrode separating patterns 250 may include forming an electrode separating layer on the substrate 10 including the dopant regions 240; and planarizing the electrode separating layer until a top surface of the electrode structure. The electrode separating layer may include at least one of a silicon oxide layer, a silicon nitride layer, and a silicon oxynitride layer. The planarization process may be performed using a planarizing technique such as a chemical-mechanical polishing (CMP) technique or an etch-back technique.

The filling insulating layer 180 of FIG. 11 and the second semiconductor layer 170 of FIG. 11 may also be planarized by the planarization process performed on the electrode separation layer. Thus, a filling insulating pattern 184 and a semiconductor body portion 175 may be conformally formed in each of the openings 105.

In some embodiments, the vertical pattern 155, the semiconductor spacer 165, the semiconductor body portion 175, and the filling insulating pattern 185 may constitute one vertical structure VS. A plurality of the vertical structures VS may penetrate the electrode structure and be two-dimensionally arranged on the substrate 10 in a plan view. The vertical structures VS are disposed positions defined by the openings 105.

Figure 17:
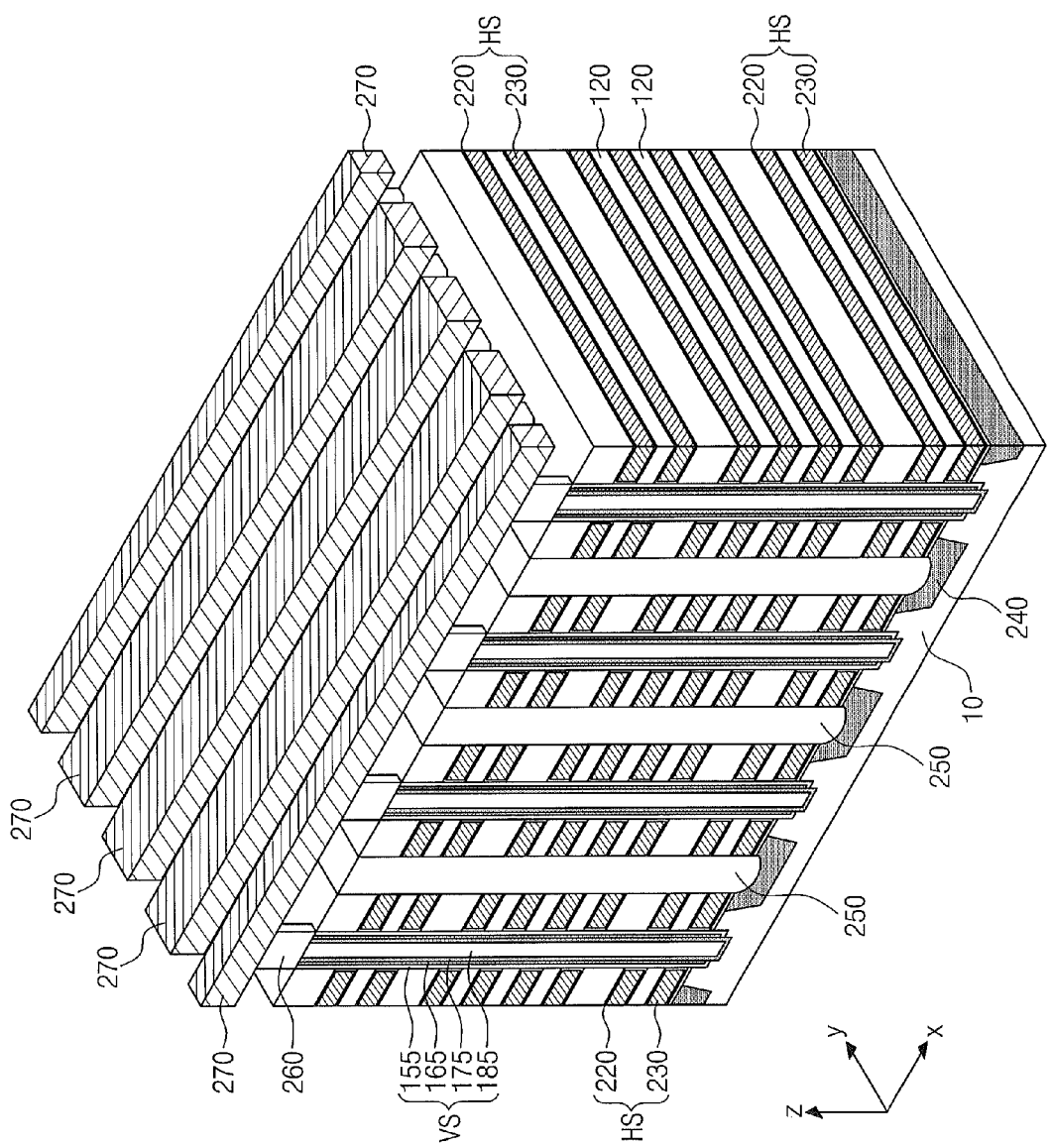

Referring to FIG. 17, upper plugs 260 may be formed on the vertical structures VS, respectively. Upper interconnections 270 may be formed on and connected to the upper plugs 260.

For example, the upper plugs 260 may include at least one of doped silicon and/or metallic materials. In some embodiments, the upper plugs 260 may be formed of silicon doped with dopants of a different conductivity type from the semiconductor body portion 175. In this case, the upper plugs 260 may constitute PN-junctions with the semiconductor spacer 165 and the semiconductor body portion 175.

Each of the upper interconnections 270 may be electrically connected to the semiconductor spacer 165 and the semiconductor body portion 175 through the upper plug 260. The upper interconnections 270 may cross over the horizontal structures HS. According to some embodiments for NAND flash memory devices, the upper interconnections may be used as bit lines BL of FIG. 1 connected to one ends of the cell strings.

FIGS. 18 to 25 are perspective views illustrating structures of data storage layers according to embodiments of the inventive concept.

The 3D semiconductor memory device according to embodiments of the inventive concept may be the flash memory device. In this case, the 3D semiconductor memory device may include a data storage layer including a tunnel insulating layer TIL, a charge storage layer CL, and a first blocking insulating layer BIL1. In some embodiments, the data storage layer may further include a second blocking insulating layer BIL2 disposed between the first blocking insulating layer BIL1 and the conductive pattern 230. Additionally, the data storage layer may further include a capping layer CPL disposed between the charge storage layer CL and the first blocking insulating layer BIL1. The layers constituting the data storage layer may be formed by a deposition technique providing an excellent step coverage property, for example, a CVD technique or an ALD technique.

Figure 20:
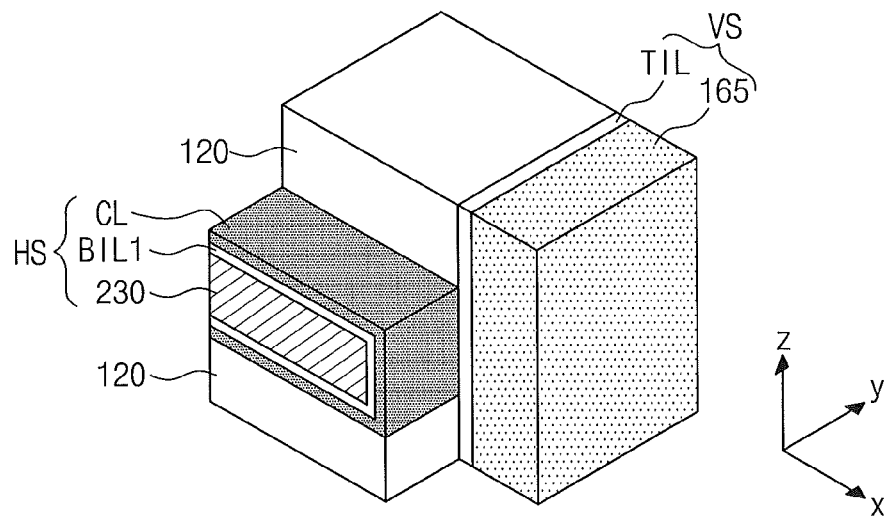
Figure 21:
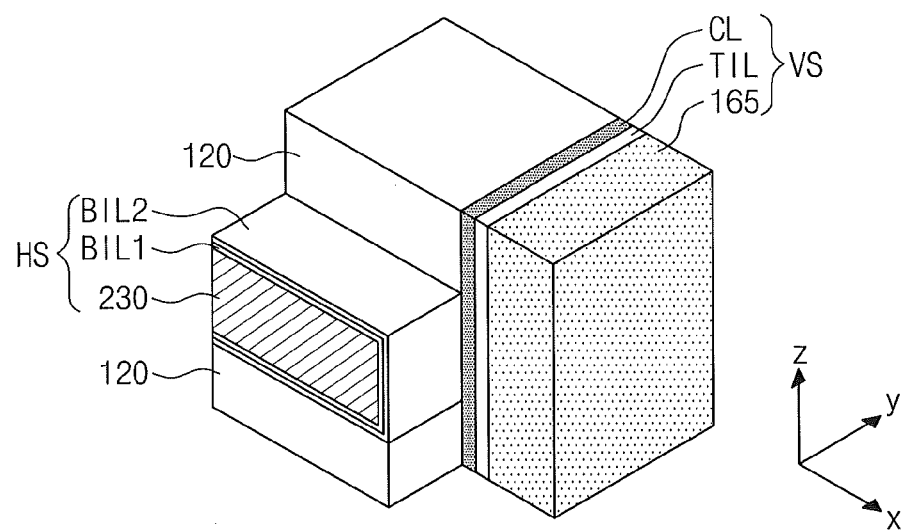
Figure 22:
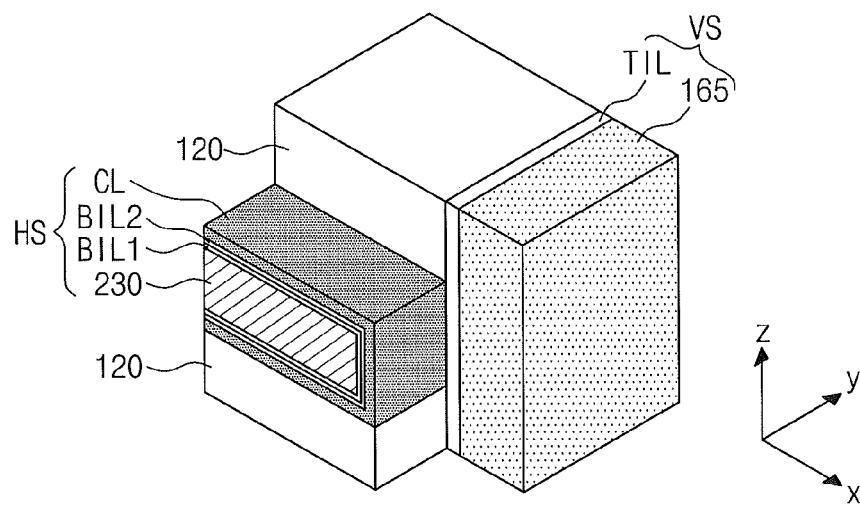

As illustrated in FIGS. 18 to 25, the vertical structure VS include at least the tunnel insulating layer TIL, and the horizontal structure HS includes at least one of the first and second blocking insulating layers BIL1 and BIL2. In some embodiments, the vertical structure VS may include the charge storage layer CL as illustrated in FIGS. 18, 19, 21, 23, 24, and 25. In other embodiments, the horizontal structure HS may include the charge storage layer CL as illustrated in FIGS. 20 and 22.

If the vertical structure VS includes the charge storage layer CL, the vertical structure VS may further include the capping layer CPL as illustrated in FIGS. 18, 23, 24, and 25. Alternatively, the vertical structure VS may be in contact with the horizontal structure HS without the capping layer CPL.

Figure 18:
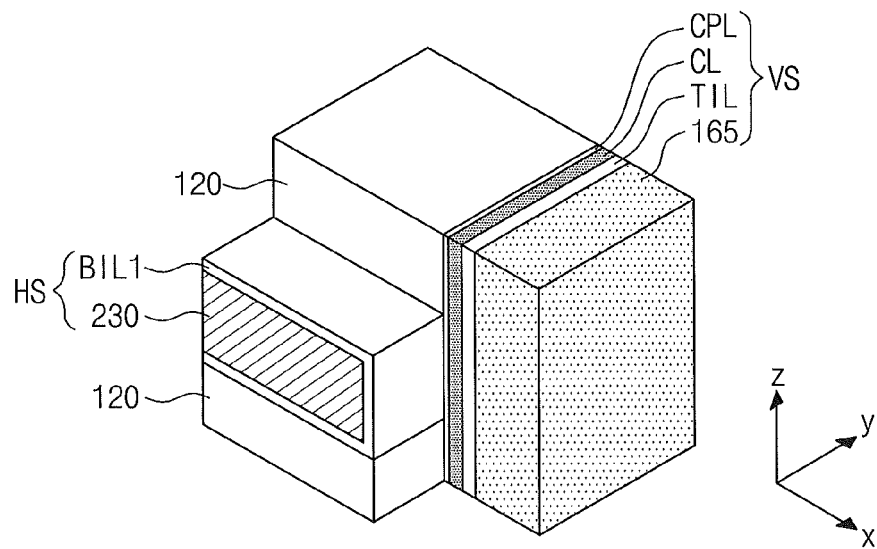
FIGS. 18 to 25 are perspective views illustrating structures of data storage layers according to embodiments of the inventive concept.
Figure 19:
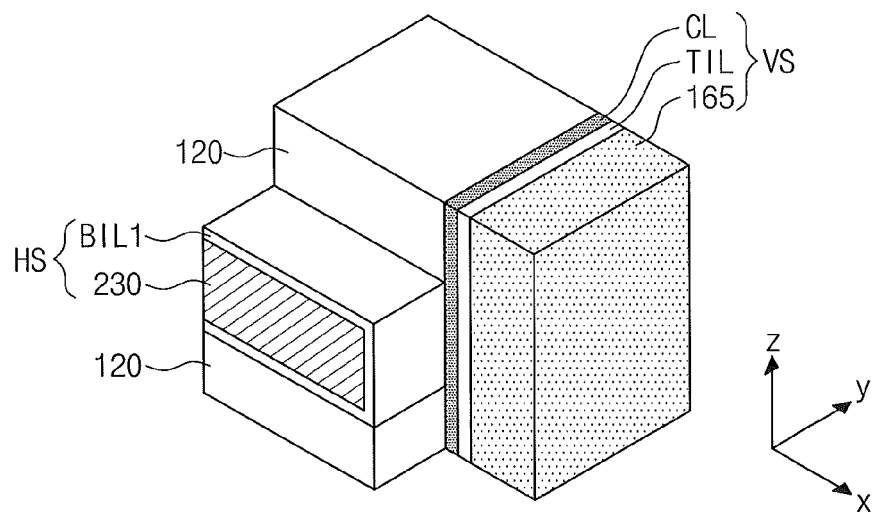
Figure 23:
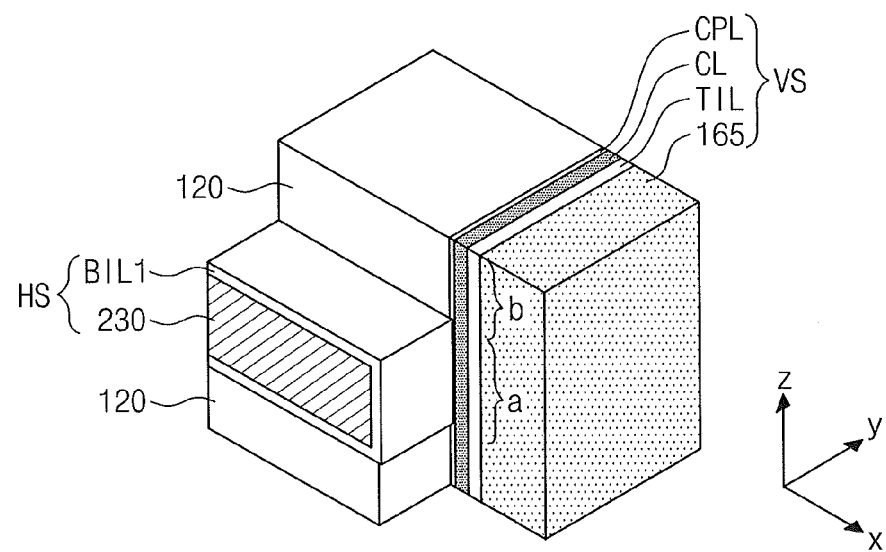
Figure 24:
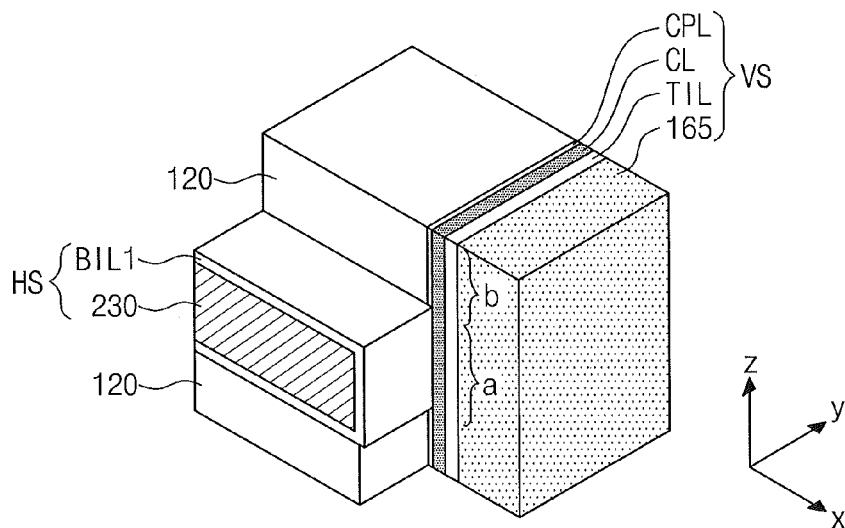

Meanwhile, a sidewall thickness of the capping layer CPL may be non-uniform. For example, the sidewall of the capping layer CPL adjacent to the horizontal structure HS may be horizontally recessed during the formation of the recess regions 210. In this case, the capping layer CPL in a region (a) adjacent to the horizontal structure HS (or a channel region) may be thicker than the capping layer CPL in a region (b) between the horizontal structures HS (or a vertical adjacent region) as illustrated in FIG. 23. Alternatively, the capping layer CPL may be locally remain in the vertical adjacent region (b), and the horizontal structure HS may be in contact with a sidewall of the charge storage layer CL in the channel region (a) as illustrated in FIG. 24. In other embodiments, the sidewall thickness of the capping layer CPL may be substantially uniform as illustrated in FIGS. 18 and 25.

Figure 25:
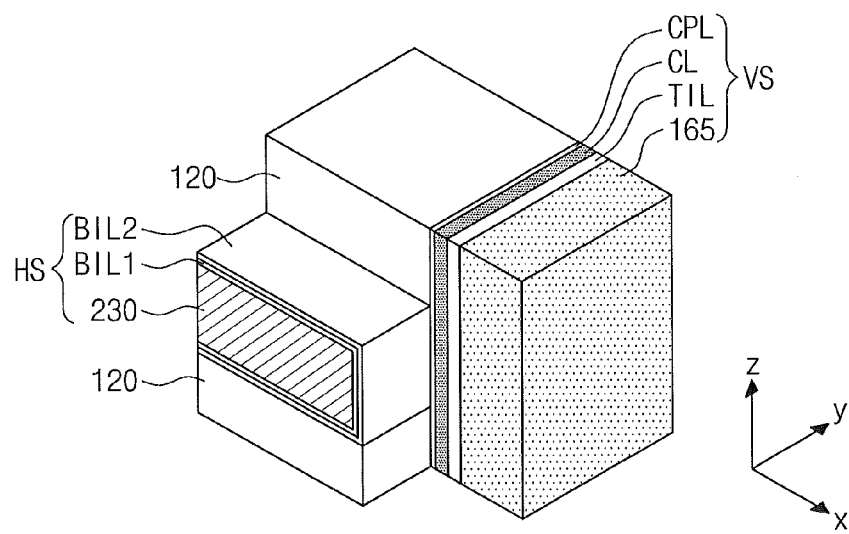

In some embodiments, the horizontal structure HS may include all of the first and second blocking insulating layers BIL1 and BIL2 as illustrated in FIGS. 21, 22, and 25.

The charge storage layer CL may include at least one of trap site-rich insulating layers, and insulating layers including nano particles. The charge storage layer CL may be formed by a CVD technique and/or an ALD technique. For example, the charge storage layer CL may include one of a trap insulating layer, a floating gate electrode, and an insulating layer including conductive nano dots. In more detail, the charge storage layer CL may include at least one of a silicon nitride layer, a silicon oxynitride layer, a silicon-rich nitride layer, a nano-crystalline silicon layer, and a laminated trap layer.

The tunnel insulating layer TIL may include one of insulating materials having an energy band gap greater than that of the charge storage layer CL and be formed by a CVD technique or an ALD technique. For example, the tunnel insulating layer TIL may be a silicon oxide layer formed by the CVD or ALD technique. Additionally, a predetermined annealing process may be performed on the tunnel insulating layer TIL after the deposition process. The annealing process may be a rapid thermal nitridation (RTN) process, or an annealing process performed under an atmosphere including at least one of nitrogen and oxygen.

The first and second blocking insulating layers BIL1 and BIL2 may be formed of materials different from each other, respectively. One of the first and second blocking insulating layers BIL1 and BIL2 may be formed of one of materials having an energy band gap equal to or smaller than that of the tunnel insulating layer TIL and greater than that of the charge storage layer CL. Each of the first and second blocking insulating layers BIL1 and BIL2 may be formed by a CVD or ALD technique. In other embodiments, at least one of the first and second blocking insulating layers BIL1 and BIL2 may be formed by a wet oxidation process. In an embodiment, the first blocking insulating layer BIL1 may be formed of at least one of high-k dielectric layers such as aluminum oxide layer and a hafnium oxide layer, and the second blocking insulating layer BIL2 may be formed of a material having a dielectric constant smaller than that of the first blocking insulating layer BIL1. In another embodiment, the second blocking insulating layer BIL2 may be formed of at least one of the high-k dielectric layers, and the first blocking insulating layer BIL1 may be formed of a material having a dielectric constant smaller than that of the second blocking insulating layer BIL2. According to a modified embodiment, at least one additional blocking insulating layer (not shown) may be further formed between the charge storage layer CL and the conductive pattern 230.

The capping layer CPL may be formed of a material having an etch selectivity with respect to the charge storage layer CL or the sacrificial layer 130. For example, if the sacrificial layer 130 is formed of a silicon nitride layer, the capping layer CPL may be formed of a silicon oxide layer. In this case, the capping layer CPL may function as an etch stop layer preventing etching damage of the charge storage layer CL in the process removing the sacrificial layers 130 for the formation of the recess regions 210. As illustrated in FIGS. 18, 23, 24, and 25, if the capping layer CPL remains between the conductive layer 230 and the charge storage layer CL, the capping layer CPL may be formed of a material capable of preventing leakage (e.g., back-tunneling) of charges stored in the charge storage layer CL. For example, the capping layer CPL may be formed of a silicon oxide layer and high-k dielectric layers.

Figure 26:
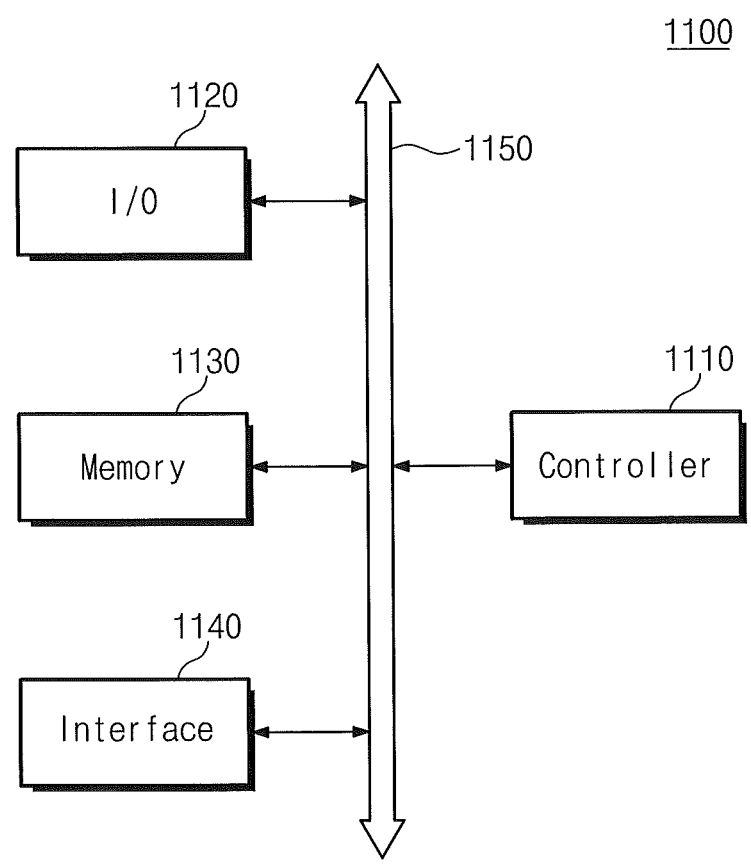
FIG. 26 is a schematic block diagram illustrating an example of memory systems including 3D semiconductor memory devices according to embodiments of the inventive concept.

FIG. 26 is a schematic block diagram illustrating an example of memory systems including 3D semiconductor memory devices according to embodiments of the inventive concept.

Referring to FIG. 26, a memory system 1100 may be applied to a personal digital assistant (PDA), a portable computer, a web tablet, a wireless phone, a mobile phone, a digital music player, a memory card or other electronic products. The other electronic products may receive or transmit information data by wireless.

The memory system 1100 may include a controller 1110, an input/output (I/O) unit 1120, a memory device 1130, an interface unit 1140, and a data bus 1150. The memory device 1130 and the interface unit 1140 may communicate with each other through the data bus 1150.

The controller 1110 may include at least one of a microprocessor, a digital signal processor, a microcontroller, and other logic devices. The other logic devices may have a similar function to any one of the microprocessor, the digital signal processor and the microcontroller. The memory device 1130 may store data and/or commands performed by the controller 1110. The I/O unit 1120 may receive data or signals from the outside of the system 1100 or transmit data or signals to the outside of the system 1100. For example, the I/O unit 1120 may include a keypad, a keyboard and/or a display unit.

The memory device 1130 may include at least one of the 3D semiconductor memory devices according to embodiments of the inventive concept. The memory device 1130 may further include at least one of other various kinds of memory devices, volatile memory device capable of randomly accessing data.

The interface unit 1140 may transmit electrical data to a communication network or may receive electrical data from a communication network.

Figure 27:
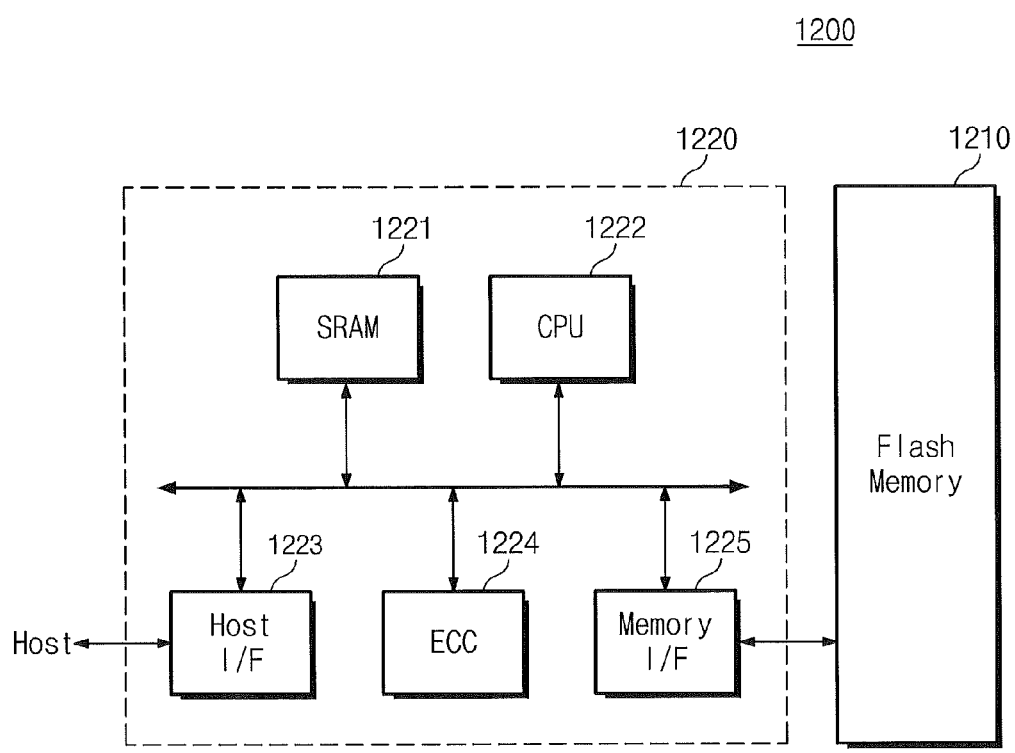
FIG. 27 is a schematic block diagram illustrating an example of memory cards including 3D semiconductor memory devices according to embodiments of the inventive concept.

FIG. 27 is a schematic block diagram illustrating an example of memory cards including 3D semiconductor memory devices according to embodiments of the inventive concept.

Referring to FIG. 27, a memory card 1200 for supporting mass data storage may include a flash memory device 1210. The flash memory device 1210 may include at least one of the 3D semiconductor memory devices according to the aforementioned embodiments of the inventive concept. The memory card 1200 may include a memory controller 1220 that controls data communication between a host and the memory device 1210.

A static random access memory (SRAM) 1221 may be used as an operation memory of a central processing unit (CPU) 1222. A host interface unit 1223 may be configured to include a data communication protocol between the memory card 1200 and the host. An error check and correction (ECC) block 1224 may detect and correct errors of data which are read out from the memory device 1210. A memory interface unit 1225 may interface with the flash memory device 1210 according to embodiments of the inventive concept. A central processing unit (CPU) 1222 may control overall operations for data exchange of the memory controller 1220. Even though not shown in the drawings, the memory card 1200 may further include a read only memory (ROM) device that stores code data to interface with the host.

Figure 28:
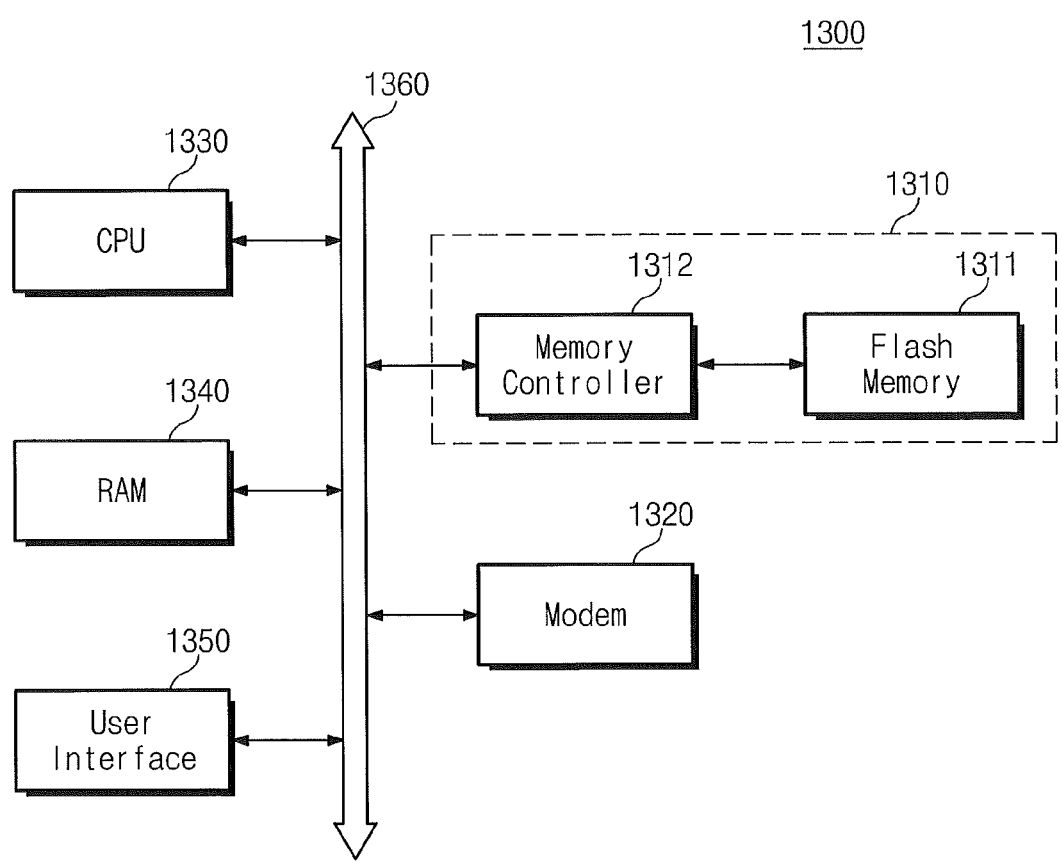
FIG. 28 is a schematic block diagram illustrating an example of information processing systems including 3D semiconductor memory devices according to embodiments of the inventive concept.

FIG. 28 is a schematic block diagram illustrating an example of information processing systems including 3D semiconductor memory devices according to embodiments of the inventive concept.

Referring to FIG. 28, a flash memory system 1310 may be installed in an information process system 1300 such as a mobile device or a desk top computer. The flash memory system 1310 may include at least one of the 3D semiconductor memory devices in the embodiments described above. The information process system 1300 according to the inventive concept may include a modem 1320, a central processing unit (CPU) 1330, a random access memory (RAM) 1340, and a user interface unit 1350 that are electrically connected to the flash memory system 1310 through a system bus 1360. The flash memory system 1310 may be substantially the same as the aforementioned memory system or flash memory system. Data processed by the CPU 1330 or data inputted form the outside of flash memory system 1310 may be stored in the flash memory system 1310. Here, the flash memory system 1310 may be realized as a solid state disk (SSD) device. In this case, the information processing system 1300 may stably store massive data in the flash memory system 1310. Additionally, as reliability of the flash memory system 1310 may increase, the flash memory system 1310 may reduce a resource consumed for correcting errors. Even though not shown in the drawings, an application chipset and/or a camera image processor (CIS), an input/output unit may further be provided in the information processing system 1300.

Additionally, the 3D semiconductor memory devices or the memory systems according to the inventive concept may be encapsulated using various packaging techniques. For example, the flash memory devices or the memory systems according to the inventive concept may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

According to embodiments of the inventive concept, the trench penetrating the stack structure has the bottom surface having the rounded profile, so that the conductive layer may be substantially uniform in the trench. Thus, the process time of the process removing the conductive layer in the trench may be reduced. As a result, it is possible to minimize the etching damage of the conductive pattern included in the horizontal pattern, such that the 3D semiconductor memory device having excellent reliability may be realized.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A three-dimensional (3D) nonvolatile memory device, comprising:
    a vertical stack of nonvolatile memory cells on a substrate having a region of first conductivity type therein;
    a dopant region of second conductivity type in the substrate, said dopant region forming a P-N rectifying junction with the region of first conductivity type and having a concave upper surface that is recessed relative to an upper surface of the substrate upon which said vertical stack of nonvolatile memory cells extends; and
    an electrically insulating electrode separating pattern extending through said vertical stack of nonvolatile memory cells and into the recess in said dopant region of second conductivity type, said electrically insulating electrode separating pattern having a width and a bottom surface with a convex shape and a radius of curvature that is greater than one half the width.

2. The memory device of claim 1, wherein said vertical stack of nonvolatile memory cells comprises first and second stacks of gate electrodes; and wherein said electrically insulating electrode separating pattern region extends vertically between the first and second stacks of gate electrodes.

3. The memory device of claim 1, wherein said electrically insulating electrode separating pattern contacts said dopant region of second conductivity type.

4. The memory device of claim 3, wherein the radius of curvature is less than a width of said electrically insulating electrode separating pattern.

5. A three-dimensional (3D) semiconductor memory device comprising:
- an electrode structure including insulating patterns and conductive patterns which are alternately and repeatedly stacked on a substrate;
- a semiconductor pattern penetrating the electrode structure and connected to the substrate; and
- an electrode separating pattern adjacent to a side of the electrode structure,
- wherein a bottom surface of the electrode separating pattern has a rounded profile with a radius of curvature that is greater than one half a width of the electrode separating pattern and smaller than the width of the electrode separating pattern.

6. The 3D semiconductor memory device of claim 5, wherein the electrode separating pattern is in contact with the substrate; and
- wherein the bottom surface of the electrode separating pattern is disposed at a level lower than a top surface of the substrate under the electrode structure.

7. The 3D semiconductor memory device of claim 5, wherein the electrode structure is provided in plural; and
- wherein the electrode separating pattern is disposed between the electrode structures adjacent to each other.

8. The 3D semiconductor memory device of claim 5, further comprising:
- a dopant region disposed in the substrate,
- wherein the electrode separating pattern is in contact with the dopant region.

9. The 3D semiconductor memory device of claim 5, wherein the semiconductor pattern comprises:
- a spacer penetrating the electrode structure and having a hollow cylindrical shape; and
- a body portion disposed in the spacer and being in contact with the substrate.

10. A three-dimensional (3D) nonvolatile memory device, comprising:
- a vertical stack of nonvolatile memory cells on a substrate having a region of first conductivity type therein;
- a dopant region of second conductivity type in the substrate, said dopant region forming a P-N rectifying junction with the region of first conductivity type and having a generally concave upper surface that is recessed relative to an upper surface of the substrate upon which said vertical stack of nonvolatile memory cells extends; and
- an electrically insulating electrode separating pattern extending through said vertical stack of nonvolatile memory cells and into the recess in said dopant region of second conductivity type, said electrically insulating electrode separating pattern having a width and a bottom surface with a generally convex shape;
- wherein a radius of curvature at all points along the bottom surface of said electrically insulating electrode separating pattern is greater than one half the width.

* * * * *